(12) United States Patent
Hayashishita et al.

(10) Patent No.: US 8,728,910 B2
(45) Date of Patent: May 20, 2014

(54) EXPANDABLE FILM, DICING FILM, AND METHOD OF PRODUCING SEMICONDUCTOR DEVICE

(75) Inventors: Eiji Hayashishita, Nagoya (JP); Katsutoshi Ozaki, Nagoya (JP); Mitsuru Sakai, Kisarazu (JP); Setsuko Oike, Yokohama (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 0 days.

(21) Appl. No.: 13/576,786

(22) PCT Filed: Sep. 28, 2011

(86) PCT No.: PCT/JP2011/005466
§ 371 (c)(1),
(2), (4) Date: Aug. 2, 2012

(87) PCT Pub. No.: WO2012/042869
PCT Pub. Date: Apr. 5, 2012

(65) Prior Publication Data
US 2012/0309170 A1  Dec. 6, 2012

(30) Foreign Application Priority Data

Sep. 30, 2010 (JP) ................. 2010-222046
Apr. 1, 2011 (JP) ................. 2011-082113

(51) Int. Cl.
*H01L 21/30* (2006.01)
*H01L 21/46* (2006.01)

(52) U.S. Cl.
USPC .......... 438/458; 156/250; 257/E21.596; 257/E21.599; 428/343; 438/118; 438/455; 438/459; 438/464

(58) Field of Classification Search
USPC .......... 156/250; 257/E21.596, E21.599; 428/343; 525/240; 438/118, 455, 458, 438/459, 464
See application file for complete search history.

(56) References Cited

U.S. PATENT DOCUMENTS

| 6,506,490 | B1 | 1/2003 | Yamamoto |
| 2003/0031862 | A1 | 2/2003 | Yamamoto et al. |
| 2008/0085977 | A1* | 4/2008 | Okamoto et al. ............. 525/240 |

FOREIGN PATENT DOCUMENTS

| JP | 59-74178 A | 4/1984 |
| JP | 2-215528 A | 8/1990 |

(Continued)

OTHER PUBLICATIONS

*International Search Report (PCT/ISA/210) issued on Nov. 8, 2011, by the Japanese Patent Office as the International Searching Authority for International Application No. PCT/JP2011/005466.

*Primary Examiner* — Asok K Sarkar
(74) *Attorney, Agent, or Firm* — Buchanan Ingersoll & Rooney PC

(57) ABSTRACT

To provide an olefinic expandable substrate and a dicing film that exhibits less contamination characteristics, high expandability without necking, which cannot be achieved by conventional olefinic expandable substrates. In order to achieve the object, an expandable film comprises a 1-butene-α-olefin copolymer (A) having a tensile modulus at 23° C. of 100 to 500 MPa and a propylenic elastomer composition (B) comprising a propylene-α-olefin copolymer (b1) and having a tensile modulus at 23° C. of 10 to 50 MPa, wherein the amount of the component (B) is 30 to 70 weight parts relative to 100 weight parts in total of components (A) and (B).

12 Claims, 5 Drawing Sheets

(56) References Cited

FOREIGN PATENT DOCUMENTS

| JP | 11-297646 A | 10/1999 |
| JP | 2002-235055 A | 8/2002 |
| JP | 2002-343747 A | 11/2002 |
| JP | 3340979 B2 | 11/2002 |
| JP | 3443110 B2 | 9/2003 |
| JP | 2004-115591 A | 4/2004 |
| JP | 3845129 B2 | 11/2006 |
| JP | 3984075 B2 | 9/2007 |
| JP | 3984076 B2 | 9/2007 |
| JP | 2008-4836 A | 1/2008 |
| JP | 2009-267389 A | 11/2009 |

* cited by examiner

EXPANDABLE FILM, DICING FILM, AND METHOD OF PRODUCING SEMICONDUCTOR DEVICE

TECHNICAL FIELD

The present invention relates to an expandable film and a dicing film including the expandable film. The dicing film is useful as an adhesive sheet that is bonded to a front or rear surface of a semiconductor wafer in a process involving dicing the wafer into individual dice (chips) and automatically picking up the chips for recovery. The present invention also relates to a method of manufacturing a semiconductor device using the dicing film and a semiconductor device produced by the method.

BACKGROUND ART

In a process of manufacturing semiconductor devices, a silicon wafer having a predetermined circuit pattern is diced into individual chips with a rotating round blade. A common way during the process involves bonding the silicon wafer to an adhesive film, dicing the silicon wafer into individual chips, stretching the adhesive film in lateral and longitudinal directions to expand the chip-to-chip distance, and picking up the chips (see Patent Literature 1). In recent years, laser ablation dicing of semiconductor substrates has attract attention because this dicing technique can process the substrates with high precision without thermal damaging compared to blade dicing. A proposed process in this technique involves fixing a work onto a dicing sheet and dicing the work with laser light (refer to PTL 2).

A manufacturing process of light emitting diodes (LEDs) using materials such as sapphire, gallium and arsenic yields individual chips of several hundred micrometers in size and therefore requires expansion of the chip-to-chip distance through sufficient stretching of an adhesive dicing film. A disadvantage of LED substrates that are fragile compared to silicon is that the dice are subjected to chipping during the conventional blade dicing. There has been a demand in the art for an expandable dicing substrate that is suitable for laser ablation dicing—a technique that is less damaging to substrates—and provides less contamination and sufficient expandability.

A requirement for an expandable dicing substrate is uniform stretching of the entire substrate without necking during a stretching operation. Necking results in partial expansion at the peripheries of the film with insufficient expansion in a central region of the film, and thus insufficient separation of chips in the central region. A commonly used expandable dicing substrate is soft vinyl chloride which barely undergoes necking (see, e.g., Patent Literature 3). A disadvantage of the expandable dicing substrate is contamination of the wafer by transfer of plasticizers contained in soft vinyl chloride through the adhesive layer (see Patent Literature 4). An expandable substrate composed of plasticizer-free thermoplastic polyolefin has been proposed as a substitution for vinyl chloride. Unfortunately, such an expandable substrate exhibits poor expansion and significant necking compared to vinyl chloride, resulting in an insufficient chip-to-chip distance, although it can reduce contamination of wafers.

Patent Literature 1 discloses a dicing film including a substrate and an adhesive layer, the substrate being composed of a thermoplastic resin having rubber elasticity and an ethylenic resin. A possible concern of the dicing film is necking, despite reduced contamination of a wafer.

Patent Literature 5 discloses a dicing film including an expandable substrate of a terpolymer (ionomer resin) composed of ethylene, acrylic acid, and alkyl acrylate ester as components.

Patent Literature 6 discloses a dicing film including an expandable substrate that is composed of a semi-compatible or non-compatible polymer blend containing a highly crystalline olefinic resin and a lowly crystalline olefin resin and that barely generates linty dust during dicing. Exemplified lowly crystalline olefinic resins are low-density polyethylene, random polypropylene copolymer, and ethylene-vinyl acetate copolymer.

Patent Literatures 7 to 9 each disclose a dicing film including an expandable substrate that is composed of propylene and ethylene, and/or α-olefinic thermoplastic elastomer having four to eight carbon atoms and that barely generates linty dust during dicing. According to the description, the α-olefinic thermoplastic elastomer may contain additives such as low-density polyethylene, polypropylene, polybutene, and polyesters.

CITATION LIST

Patent Literature

[PTL 1] Japanese Patent Application Laid-Open No. 02-215528
[PTL 2] Japanese Patent Application Laid-Open No. 2002-343747
[PTL 3] Japanese Patent Application Laid-Open No. 2002-235055
[PTL 4] Japanese Patent Application Laid-Open No. 59-74178
[PTL 5] Japanese Patent No. 3845129
[PTL 6] Japanese Patent No. 3340979
[PTL 7] Japanese Patent No. 3443110
[PTL 8] Japanese Patent No. 3984075
[PTL 9] Japanese Patent No. 3984076

SUMMARY OF INVENTION

Technical Problem

Although the dicing film disclosed in Patent Literature 5 exhibits high expandability and less necking, foreign materials inherent in polymerization may remain in the dicing film. Laser dicing may cause the foreign materials to scatter laser light. The dicing film disclosed in Patent Literature 6 exhibits insufficient expandability and therefore is prone to rupture during stretching, which raises a concern of wafer damaging during expansion. In the dicing films disclosed in Patent Literatures 7 to 9, the preferred thermoplastic elastomer content is 80 weight percent or more, which content may cause insufficient expansion.

An object of the present invention, in view of the problems described above, is to provide a low-contamination olefinic expandable substrate (expandable film) and a dicing film including the substrate. Another object of the present invention is to provide an olefinic expandable substrate that has exhibits high expandability, which has been insufficient in conventional olefinic expandable substrates, as well as less necking, and a dicing film including the substrate.

Solution to Problem

The present inventors have intensively studied in order to develop an expandable substrate exhibiting high expandability, less necking, and low contamination. As a result, the inventors have established that the object can be achieved when the following conditions are satisfied, and completed the present invention.

1) The substrate contains (A) a 1-butene-α-olefin copolymer having a tensile strength of 100 to 500 MPa; and 2) The substrate contains (B) a propylenic elastomer composition containing (b1) a propylene/butene-α-olefin copolymer and (b2) polypropylene, the composition (B) having a tensile strength of 8 to 500 MPa;

3) The amount of the composition (B) is in the range of 30 to 70 weight parts relative to 100 weight parts in total of the components (A) and (B).

A substrate containing only the component (A) exhibits insufficient expandability and is likely to exhibit necking, whereas a substrate containing only the component (B) exhibits insufficient expandability and low tensile strength, resulting in poor handling performance. Even when a substrate contains both the components (A) and (B), a component (A) content exceeding 70 weight parts relative to 100 weight parts in total of the components (A) and (B) causes necking to more likely to occur, whereas a component (B) content exceeding 70 weight parts relative to 100 weight parts in total of the components (A) and (B) results in low expandability and thus poor handling performance. In contrast, satisfying the requirements 1) to 3) leads to an expandable substrate that exhibits high expandability, less necking, low contamination, and high handling performance.

A first aspect of the present invention relates to an expandable film.

[1] A expandable film including: (A) a 1-butene-α-olefin copolymer having a tensile strength of 100 to 500 MPa at 23° C.; and (B) a propylenic elastomer composition containing (b1) a propylene/butene-α-olefin copolymer having a tensile strength of 8 to 500 MPa at 23° C., wherein an amount of the component (B) is in the range of 30 to 70 weight parts relative to 100 weight parts in total of the components (A) and (B).

[2] The expandable film according to [1], wherein the propylenic elastomer composition (B) has a tensile strength at 23° C. of 10 to 50 MPa.

[3] The expandable film according to [1] or [2], wherein the propylenic elastomer composition (B) contains 1 to 70 weight parts of a polypropylene (b2) relative to 100 weight parts of the propylenic elastomer composition (B).

[4] The expandable film according to [3], wherein the propylenic elastomer composition (B) contains 5 to 20 weight parts of the polypropylene (b2) relative to 100 weight parts of the propylenic elastomer composition (B).

A second aspect of the present invention relates to a dicing film including an expandable film and a method of manufacturing a semiconductor device.

[5] A dicing film including: a substrate layer and an adhesive layer, the substrate layer including the expandable film of any one of [1] to [4], wherein the adhesive layer is an outermost layer of the dicing film and has an adhesive force of 0.1 to 10 N/25 mm measured in accordance with JIS Z0237 when the dicing film is peeled off from a surface of a stainless steel-304-BA plate 60 minutes after the adhesive layer is bonded to the surface of the stainless steel-304-BA plate.

[6] The dicing film according to [5], wherein the MFR of the substrate layer at 230° C. and the MFR of the adhesive layer at 230° C. which are measured in accordance with ASTM D1238 are both in the range of 1 to 20 g/10 min.

[7] A dicing film including: a substrate layer and an intermediate layer, the substrate layer including the expandable film of any one of [1] to [4], wherein the intermediate layer satisfies the relation $E(60)/E(25)<0.1$ where $E(25)$ is a tensile modulus $E(25)$ at 25° C. and $E(60)$ is a tensile modulus at 60° C., and the tensile modulus at 25° C. is in the range of 1 to 10 MPa.

[8] The dicing film according to [5], further including an intermediate layer between the substrate layer and the adhesive layer, wherein the intermediate layer satisfies the relation $E(60)/E(25)<0.1$ where $E(25)$ is a tensile modulus at 25° C. and $E(60)$ is a tensile modulus at 60° C., and the tensile modulus $E(25)$ at 25° C. is in the range of 1 to 10 MPa.

[9] The dicing film according to [7] or [8], wherein the intermediate layer contains an olefinic copolymer.

[10] The dicing film according to any one of [7] to [9], wherein the intermediate layer has a density of 800 to 890 kg/m$^3$.

[11] The dicing film according to any one of [7] to [10], wherein the dicing film is for bonding on at least one surface of a semiconductor wafer, the surface having irregularities on at least one side, and the intermediate layer has a thickness larger than the height of the irregularities of the semiconductor wafer.

[12] A method of manufacturing a semiconductor device including: bonding the dicing film according to [5] to a semiconductor wafer with the adhesive layer of the dicing film; dicing the semiconductor wafer into semiconductor chips; and expanding the dicing film and picking up the semiconductor chips.

[13] A method of manufacturing a semiconductor-manufacturing device including: bonding the dicing film according to [8] to a semiconductor wafer with the adhesive layer of the dicing film at a temperature of 40 to 80° C. and a pressure of 0.3 to 0.5 MPa; dicing the semiconductor wafer into semiconductor chips; and expanding the dicing film and picking up the semiconductor chips.

Advantageous Effects of Invention

The present invention provides an olefinic expandable substrate (expandable film) having low contamination and high expandability, which is insufficient in conventional olefinic expandable substrates, with less necking, and provides a dicing film including the substrate.

DESCRIPTION OF EMBODIMENTS

1. Expandable Film

Figure 1A:
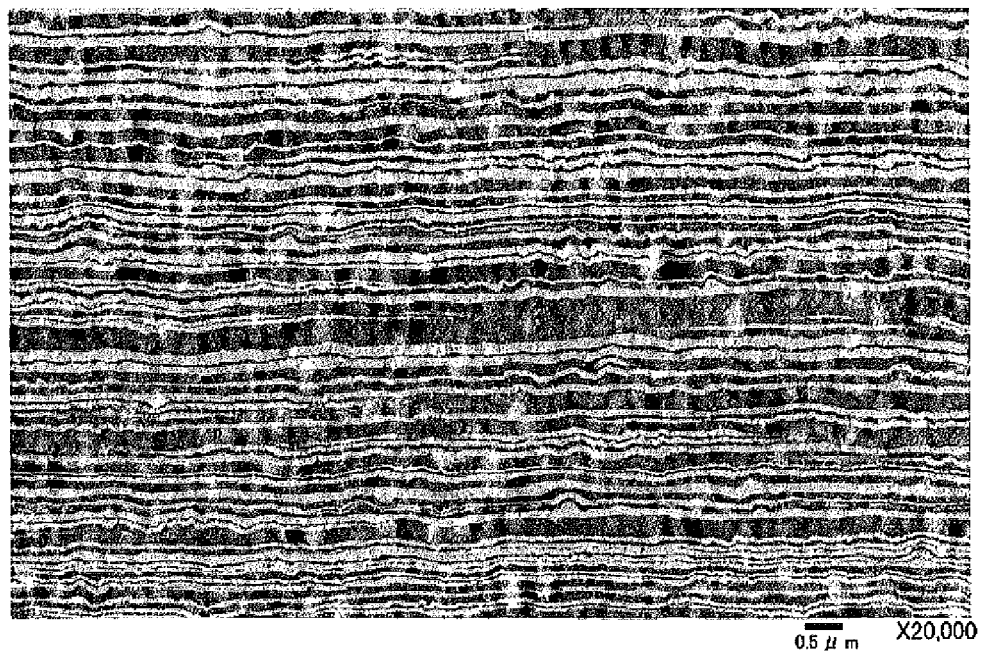
FIG. 1A is a sectional TEM image parallel to the MD direction of a substrate layer of an expandable film according to an embodiment of the present invention.

An expandable film of the present invention contains (A) a 1-butene-α-olefin copolymer and (B) propylenic elastomer composition.

(A) 1-butene-α-olefin Copolymer

The 1-butene-α-olefin copolymer (A) contained in the expandable film is a polymer containing 1-butene as the primary component. The α-olefins in the 1-butene-α-olefin copolymer (A) may be α-olefins having 2 to 10 carbon atoms other than 1-butene. Examples of the α-olefins having 2 to 10 carbon atoms include ethylene, propylene, 1-pentene, 1-hexene, 1-heptene, 1-octene, 1-nonene, and 1-decene. Preferred are ethylene and propylene. The α-olefins contained in the 1-butene-α-olefin copolymer (A) may be used alone or in combination. The amount of 1-butene contained in the 1-butene-α-olefin copolymer (A) is preferably 80 mol % or more, and more preferably 90 mol % or more. An amount less than 80 mol % fails to ensure sufficient expandability.

The 1-butene-α-olefin copolymer (A) may have any density and has a density of 890 to 950 kg/m$^3$ in a preferred embodiment. A lower density leads to a decrease in tensile modulus and thus insufficient expandability.

The film containing the 1-butene-α-olefin copolymer (A) has a tensile strength of preferably 100 to 500 MPa and more preferably 150 to 450 MPa at 23° C. An excessively high tensile strength makes expansion of the film difficult due to its high hardness. An excessively low tensile strength leads to poor handling performance due to excessive softness of the film.

The 1-butene-α-olefin copolymer (A) may have any melt flow rate (MFR) which is determined at 230° C. and a load of 2.16 kg in accordance with ASTM D1238, provided that the copolymer can be readily compatible with the propylenic elastomer composition (B) in an extruder. The MFR is in the range of preferably 1 to 20 g/10 min and more preferably 1 to 10 g/10 min since the copolymer can be uniformly extruded with the propylenic elastomer composition (B).

The 1-butene-α-olefin copolymer (A) can be prepared by any known process, for example, copolymerization of 1-butene with any α-olefin other than 1-butene in the presence of a Ziegler-Natta or metallocene catalyst.

Propylenic Elastomer Composition (B)

The propylenic elastomer composition (B) contained in the expandable film contains a propylene-α-olefin copolymer (b1) as the primary component and preferably further contains polypropylene (b2).

The propylene-α-olefin copolymer (b1) represents a copolymer of propylene with an α-olefin other than propylene. Preferred α-olefins for constituting the propylene-α-olefin copolymer (b1) are α-olefins having 2 to 20 carbon atoms. Examples of the α-olefins having 2 to 20 carbon atoms include ethylene, 1-butene, 1-pentene, 1-hexene, 1-heptene, 1-octene, 1-nonene, and 1-decene. Preferred are ethylene and 1-butene. The α-olefins for constituting the propylene-α-olefin copolymer (b1) may be used alone or in combination. The propylene-α-olefin copolymer (b1) is more preferably a propylene/1-butene/ethylene copolymer.

The amount of propylene monomer units in the propylene-α-olefin copolymer (b1) is preferably 50 mol % or more, and more preferably 60 mol % or more in view of achieving satisfactory rubber elasticity.

The propylene-α-olefin copolymer (b1) has rubber elasticity at a treating temperature of the expandable film and preferably has a glass transition temperature of 25° C. or less. A glass transition temperature above 25° C. may cause physical properties such as expandability of the shaped film to readily vary depending on storage conditions.

Polypropylene (b2) is substantially a homopolymer of propylene and may contain trace amounts of α-olefins other than propylene; thus, polypropylene may be any one of so-called homopolypropylene (hPP), random polypropylene (rPP), and block propylene (bPP). The amount of α-olefin other than propylene in the polypropylene (b2) is preferably 20 mol % or less and more preferably 10 mol % or less. Such polypropylene (b2) will have several advantageous effects such as suppression of blocking of the propylene-α-olefin copolymer (b1) and improved film formability.

The amount of polypropylene (b2) is preferably 1 to 70 weight parts, more preferably 5 to 70 weight parts, further preferably 5 to 30 weight parts, and most preferably 5 to 20 weight parts relative to 100 weight parts in total of the propylenic elastomer composition (B). An amount of polypropylene (b2) below 1 part by weight may lead to blocking of the propylene-α-olefin copolymer (b1), resulting in instable extrusion of the composition during the film extrusion process in some cases. An amount of polypropylene (b2) above 30 weight parts may lead to a small expansion rate in some cases.

The film of the propylenic elastomer composition (B) has a tensile modulus of preferably 8 to 500 MPa, more preferably 10 to 500 MPa, still more preferably 10 to 100 MPa, further preferably 10 to 50 MPa, and most preferably 10 to 45 MPa at 23° C.

The propylenic elastomer composition (B) may have any melt flow rate (MFR) provided that the propylenic elastomer composition (B) can be readily compatible with the 1-butene-α-olefin copolymer (A) in an extruder. The MFR, which is determined at 230° C. and a load of 2.16 kg in accordance with ASTM D1238, is in the range of preferably 1 to 20 g/10 min and more preferably 1 to 10 g/10 min since the composition can be extruded to have a relatively uniform thickness.

The amount of the propylenic elastomer composition (B) contained in the expandable film is in the range of preferably 30 to 70 weight parts, and more preferably 40 to 60 weight parts relative to 100 weight parts in total of the components (A) and (B).

The expandable film can be prepared through dry blending or melt blending followed by extrusion of the 1-butene-α- olefin copolymer (A) and the propylenic elastomer composition (B). The resulting expandable film has a microdispersion structure containing the 1-butene-α-olefin copolymer (A) having relatively high crystallinity and high tensile modulus and the propylenic elastomer composition (B) having relatively low crystallinity and low tensile modulus.

Figure 1B:
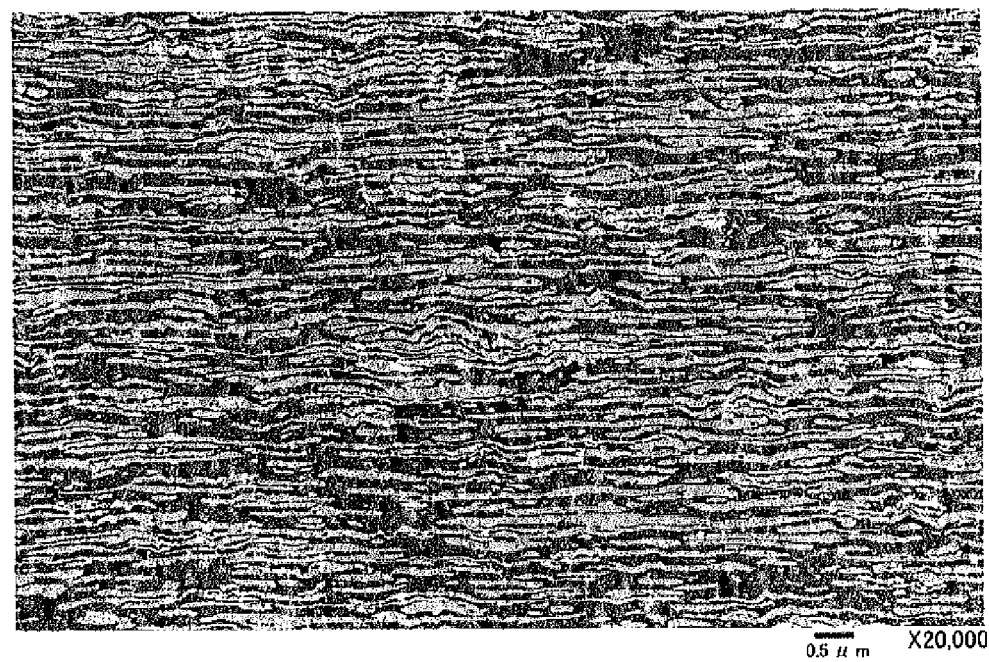
FIG. 1B is a sectional TEM image parallel to the TD direction of a substrate layer of an expandable film according to an embodiment of the present invention.

FIG. 1A is an example of a sectional TEM image parallel to the MD direction of the expandable film, while FIG. 1B is an example of a sectional TEM image parallel to the TD direction of the expandable film. As shown in FIGS. 1A and 1B, bright portions (1-butene-α-olefin copolymer (A)) are observed, extending in the direction parallel to the film surface in the TEM images.

Such a structure of microphase separation can be observed in a form of "light-dark structure" in a section of a transmission electronic microscopic (TEM) image of a thin section sample of the expandable film. In the TEM image in FIG. 1, it is observed that, for example, "bright portions" corresponding to 1-butene-α-olefin copolymer (A) and "dark portions" corresponding to propylenic elastomer composition (B). Such a structure of microphase separation is not formed in a system of highly crystalline olefinic resin and lowly crystalline olefinic resin disclosed in Patent Literature 5 (Japanese Patent No. 3340979), but can be formed by a specific combination of the 1-butene-α-olefin copolymer (A) and propylenic elastomer composition (B) in the present invention.

The mechanism is not clear but is speculated as follows: Stress applied to an expandable film having a structure of microphase separation leads to elastic deformation of the 1-butene-α-olefin copolymer (A). This deformation uniformalizes the stress applied to the 1-butene-α-olefin copolymer (A) via the propylenic elastomer composition (B) in the cross-section direction of the film before necking occurs. The uniform deformation results in isotropic deformation of the higher-order structure of the 1-butene-α-olefin copolymer (A) in the overall expandable film. The elastically deformable range is thus enlarged without occurrence of necking.

The expandable film can be observed as follows: The expandable film is cut in the directions parallel to the MD and TD directions into two 100 µm thick samples, and the resulting cross-sectional surfaces are observed with a transmission electron microscope (TEM, H-7650 manufactured by Hitachi Ltd.) at a magnification of 5,000 to 20,000.

The expandable film can have any thickness without restriction. In the case where the expandable film of the present invention is used as a dicing film for semiconductors, the substrate layer preferably has a thickness of about 50 to about 200 µm.

The expandable film of the present invention can be prepared by blending components and then extruding the blend (extrusion process). In the case where the expandable film contains polypropylene (b2), it is preferred that a pre-blend (propylenic elastomer composition (B)) of propylene-α-olefin copolymer (b1) and polypropylene (b2) be blended with 1-butene-α-olefin copolymer (A) and any other component and the blend is extruded into the expandable film. Such pre-blending of polypropylene (b2) and propylene-α-olefin copolymer (b1) can adjust the compatibility between the 1-butene-α-olefin copolymer (A) and the propylenic elastomer composition (B), facilitating formation of phase separation structure.

The expandable film of the present invention exhibits superior handling performance and expandability. The expandable film of the present invention can therefore be used in various applications requiring expandability, such as protective members for optical devices and dicing films used for semiconductor devices, and preferably dicing films for semiconductor devices.

2. Dicing Film

The dicing film of the present invention includes a substrate layer containing the expandable film described above, and may further include an adhesive layer, an intermediate layer, and a low-friction layer, if necessary.

Some semiconductor wafers to be diced have polyimide films, aluminum electrodes, and scribe lines for dicing on their surfaces and thus their surfaces have irregularities. In recent years, wafers have been developed frequently which are provided with gold bumps having large irregularities compared to standard LSIs and solder ball bumps used for mount boards of high-frequency devices. In such a circumference, a big challenge is to prevent damaging of semiconductor wafers having such surface irregularities during dicing.

A possible dicing process for wafers having large irregularities involves bonding a dicing film onto a patterned surface of the wafer and cutting the wafer from the other non-patterned surface with a rotating blade. If the dicing film used does no absorb irregularities, gaps are formed between the adhesion surface and the patterned surface, and debris generated during cutting may damage the patterned surface, resulting in insufficient control of contamination.

In the case where the dicing film of the present invention is used in such applications, the dicing film preferably includes an intermediate layer that can absorb surface irregularities of the semiconductor wafer. The dicing film of the present invention including an intermediate layer described later can come into close contact with the surface irregularities of the semiconductor wafer, preventing contamination of the patterned surface and damaging of the semiconductor wafer during dicing.

If adhesion between a ring frame used for dicing and the dicing film is insufficient, the dicing film may detached from the ring frame during dicing. Thus, the dicing film of the present invention preferably has high adhesion to the ring frame. Accordingly, the dicing film of the present invention preferably has an adhesive layer (described below) as an outermost layer to be bonded to the ring frame.

(1) Adhesive Layer

The adhesive layer may be composed of any known adhesive. Examples of the adhesive include adhesives of rubber adhesives, acrylic adhesives, silicone adhesives, and thermoplastic elastomers such as styrenic elastomers and olefinic elastomers. Alternatively, the adhesive layer may be composed of radiation-curable adhesives of which the adhesive force decreases by radiation rays or heat-curable adhesives of which the adhesive force decreases by heat. Examples of the radiation-curable adhesives include UV-curable adhesives.

The acrylic adhesives may be homopolymers of acrylate esters or copolymers of acrylate esters with comonomers. Examples of the acrylate esters include ethyl acrylate, butyl acrylate, and 2-ethylhexyl acrylate. Examples of the comonomers for constituting the acrylic copolymers include vinyl acetate, acrylonitrile, acrylamide, styrene, methyl methacrylate, methyl acrylate, methacrylic acid, acrylic acid, itaconic acid, hydroxyethyl methacrylate, hydroxypropyl methacrylate, (dimethylamino)ethyl methacrylate, acrylamide, methylol acrylamide, glycidyl methacrylate, and maleic anhydride.

Examples of the rubber adhesives include natural rubber, synthetic isoprene rubbers, styrene-butadiene rubbers, styrene/butadiene block copolymers, styrene/isoprene block copolymers, butyl rubber, polyisobutylene, polybutadiene, polyvinyl ethers, silicone rubbers, and chloroprene rubbers.

The rubber adhesives may further contain tackifier resins in order to enhance its adhesiveness. Examples of the tackifier resins include rosin resins and terpene resins. Preferred are terpene resins, which are high compatibility with rubber adhesives. Examples of the rosin resins include rosin, polymerized rosin, hydrogenated rosin, and rosin esters. Examples of the terpene resins include terpene resins, terpene phenolic resins, aromatic-modified terpene resins, and rosin phenolic resins. The amount of the tackifier resin is preferably in the range of 5 to 100 weight parts relative to 100 weight parts of the rubber adhesive.

Examples of the thermoplastic elastomers include polystyrene elastomers, polyolefin elastomers, polyurethane elastomers, and polyester elastomers. Among them preferred are polystyrene elastomers and polyolefin elastomers which can readily control adhesiveness and flexibility.

Examples of the polystyrene elastomers include styrene-isoprene-styrene block copolymers (SIS), styrene-ethylene/butylene-styrene block copolymers (SEBS), styrene-ethylene/propylene-styrene block copolymers (SEPS), other styrene-diene block copolymers, and hydrogenated products (e.g., hydrogenated styrene-butadiene rubbers (HSBR)) thereof.

Examples of the polyolefin elastomers include block copolymers consisting of crystalline polyolefin blocks and amorphous co-monomer blocks. Specific examples include olefin (crystalline)-ethylene-butylene-olefin (crystalline) block copolymers, polypropylene-poly(ethylene oxide)-polypropylene block copolymers, and polypropylene-polyolefin-polypropylene block copolymers. Preferred polyolefin elastomers are polyethylene elastomers.

The UV-curable adhesives and heat-curable adhesives contain adhesive components such as acrylic adhesives, curable compounds (having carbon-carbon double bonds), and photo- or thermal-polymerization initiators.

The curable compounds include monomers, oligomers, and polymers having carbon-carbon double bonds in their molecules and can be cured by radical polymerization. Examples of such curable compounds include esters of (meth)acrylic acids with polyhydric alcohols such as trimethylolpropane tri(meth)acrylate, pentaerythritol tri(meth)acrylate, tetraethylene glycol di(meth)acrylate, 1,6-hexanediol di(meth)acrylate, neopentyl glycol di(meth)acrylate, and dipentaerythritol hexa(meth)acrylate; oligomers of the ester; and isocyanurate or isocyanurate compounds such as 2-propenyl di-3-butenylcyanurate, 2-hydroxyethylbis(2-acryloxyethyl)isocyanurate, and tris(2-methacryloxyethyl)isocyanurate. In the case where the adhesive is of a UV-curable polymer type having carbon-carbon double bonds in its side chain(s), the curable compound is unnecessary.

The amount of the curable compound is in the range of preferably 5 to 900 weight parts and more preferably 20 to 200 weight parts relative to 100 weight parts of adhesive agent. A smaller amount of curable compound leads to insufficient adhesive force due to a low amount of cured component, whereas a larger amount of curable compound leads to low storage stability due to excess sensitivity to heat and light.

Any photopolymerization initiator can be used which can be cleaved by UV irradiation to form radials. Examples of such initiators include benzoin alkyl ethers such as benzoin methyl ether, benzoin isopropyl ether, and benzoin isobutyl ether; aromatic ketones such as benzyl, benzoin, benzophenone, and α-hydroxycyclohexyl phenyl ketone; aromatic ketals such as benzyl dimethyl ketal; polyvinyl benzophenone; and thioxanthones such as chlorothioxanthone, dodecylthioxanthone, dimethylthioxanthone, and diethylthioxanthone.

Thermal polymerization initiators may be organic peroxide derivatives and azo polymerization initiators. Preferred are organic peroxide derivatives, which do not generate nitrogen when being heated. Examples of the thermal polymerization include ketone peroxides, peroxyketals, hydroperoxides, dialkyl peroxides, diacyl peroxides, peroxyesters, and peroxycarbonates.

The adhesive agent may contain a cross-linking agent. Examples of the adhesive agent include epoxy compounds such as sorbitol polyglycidyl ether, polyglycerol polyglycidyl ether, pentaerythritol polyglycidyl ether, and diglycerol polyglycidyl ether; aziridine compounds such as tetramethylolmethane-tri-β-aziridinyl propionate, trimethylolpropane-tri-β-aziridinyl propionate, N,N'-diphenylmethane-4,4'-bis (1-aziridinecarboxamide), and N'-hexamethylene-1,6-bis(1-aziridinecarboxamide); isocyanate compounds, such as tetramethylene diisocyanate, hexamethylene diisocyanate, and polyisocyanates.

The adhesive layer preferably has an adhesive force in accordance with JIS Z0237 of 0.1 to 10 N125 mm after the adhesive layer is bonded onto a surface of a stainless steel-304-BA plate, is allowed to stand for 60 minutes, and then is separated from the stainless steel-304-BA. An adhesive force within such a range achieves high adhesiveness to wafers and does not leave any adhesive on the chips after the chips are separated from the adhesive layer. The adhesive force of the adhesive layer can be controlled by the amount of added cross-linking agent. It can be controlled by the method, for example, disclosed in Japanese Unexamined Patent Application Publication No. 2004-115591.

The adhesive layer may have any thickness within a range not precluding expansion of the substrate layer. It is preferred that the thickness range generally from 1 to 50 μm and preferably 1 to 25

(2) Intermediate Layer

The intermediate layer can absorb the irregularities of the semiconductor wafer. As described later, the intermediate layer may be provided, for example, between the substrate layer and the adhesive layer, or may function as the adhesive layer.

The intermediate layer preferably has a tensile modulus $E(25)$ at 25° C. and a tensile modulus $E(60)$ at 60° C. satisfying the relation $E(60)/E(25)<0.1$, more preferably $E(60)/E(25)<0.08$, and most preferably $E(60)/E(25)<0.05$. A ratio of the tensile moduli at 60° C. to 25° C. satisfying the range described above causes the intermediate layer to have thermal fusibility and to plastically deform. In detail, the intermediate layer can come into close contact with the uneven patterned surface of the semiconductor wafer when the sheet is bonded at elevated temperature and can maintain (fix) the state of the close contact with the uneven patterned surface at normal temperature after the sheet is bonded.

The intermediate layer has a tensile modulus $E(25)$ at 25° C. of preferably 1 MPa to 10 MPa and more preferably 2 MPa to 9 MPa. A tensile modulus $E(25)$ within such a range allows the intermediate layer to maintain the shape at normal temperature after the sheet is bonded and to maintain the close contact during processing. The intermediate layer has a tensile modulus $E(60)$ at 60° C. of preferably 0.005 MPa to 1.0 MPa and more preferably 0.01 MPa to 0.5 MPa. A tensile modulus $E(60)$ within such a range allows the intermediate layer to have flowability when the sheet is bonded at elevated temperature and thus well absorbs irregularities.

The tensile modulus of the resin can be measured as follows: 1) A sample film of an initial length of 140 mm, a width of 10 mm, a thickness of 75 to 100 μm is prepared as a testing sample; 2) The film is subjected to tensile test at a measurement temperature of 25° C. and a tensile rate of 50 mm/min with a chuck-to-chuck distance of 100 mm, to determine a difference (mm) in elongation of the sample; and 3) A tangential line is drawn at the initial incremental portion of the resulting S-S curve (stress-strain curve), and the tensile modulus is determined by the slope of the tangential line divided by the cross-sectional area of the sample film.

The intermediate layer has a density in the range of preferably 800 to 890 kg/m$^3$, more preferably 830 to 890 kg/m$^3$, and most preferably 850 to 890 kg/m$^3$. A density of the intermediate layer less than 800 kg/m$^3$ leads to significantly low modulus that causes low shape stability whereas a density higher than 890 kg/m$^3$ leads to significantly high modulus that causes poor absorption of surface irregularities.

The intermediate layer may be composed of any resin that satisfies the tensile modulus described above, and preferably composed of an olefinic copolymer. Preferred $\alpha$-olefinic copolymers are same as those of main building blocks consisting of $\alpha$-olefin having 2 to 12 carbon atoms.

Examples of the $\alpha$-olefin having 2 to 12 carbon atoms include ethylene, propylene, 1-butene, 1-pentene, 3-methyl-1-butene, 1-hexene, 4-methyl-1-pentene, 3-methyl-1-pentene, 1-heptene, 1-octene, 1-decene, and 1-dodecene.

Among them preferred are ethylene-$\alpha$-olefin copolymers, such as ethylene-propylene copolymers, ethylene-1-butene copolymers, and ternary copolymers consisting of ethylene, propylene, and an $\alpha$-olefin having 4 to 12 carbon atoms; and ternary copolymers of consisting of propylene, 1-butene, and an $\alpha$-olefin having 5 to 12 carbon atoms in view of superior absorption of surface irregularities. Ethylene-propylene copolymers are more preferred since propylene has high thermal fusibility among polyolefinic copolymers. Commercially available $\alpha$-olefinic copolymers include TAFMER (registered trademark) commercially available from Mitsui Chemicals, Inc.

The tensile modulus of the intermediate layer can be controlled by the kinds and proportion of monomers constituting the olefinic copolymer and the degree of modification thereof. For example, the tensile modulus at 60° C. of the olefinic copolymer can be decreased, for example, by increasing the proportion of propylene in the copolymer or by modifying the copolymer with carboxylic acid.

The intermediate layer may contain any other resin or additive in an amount that does not impair adhesion/separation characteristics to/from semiconductor wafers. Examples of such additives include ultraviolet absorbers, antioxidants, thermal stabilizers, slipping agents, softening agents, and tackifiers.

The thickness of the intermediate layer is preferably larger than the height of irregularities on one surface of a semiconductor wafer (surface to which the dicing film is bonded) and can be any value as long as it can absorb irregularities (including solder bumps) on the patterned surface of the wafer. For example, the thickness of the intermediate layer may be 100 to 300 µm for irregularities of about 100 µm in height. More specifically, the thickness of the intermediate layer is preferably one to three times and more preferably one to two times of the height of the irregularities on the wafer surface.

(3) Low-Friction Layer

The dicing film of the present invention may further include a low-friction layer on an opposite side of the dicing film to the adhesive layer, if necessary. In the case where the dicing film is used as a dicing film for semiconductor as described later, the dicing film is expanded by lifting up a stage of an expander from the lower surface in the center of the dicing film, with a ring frame fixed at the periphery of the dicing film (refer to FIG. 6 which will be explained later). If the side, in contact with the stage, of the dicing film has large friction, the film cannot readily slide on the stage and thus cannot be expanded at the portion in contact with the stage. A reduction in friction of the side, in contact with the stage, of the dicing film, more specifically, provision of providing a low-friction layer facilitates slide of the stage of the expander and thus allow the entire surface of the dicing film to be uniformly expanded.

Such a low-friction layer is composed of a resin, such as polyethylene or an ethylenic ionomer resin. The exposed surface of the low-friction layer may be coated with or contain a slipping agent in order to further enhance slippage. Examples of the slipping agent include erucamide, oleamide, silicone oil, and masterbatches containing high concentrations of these slipping agents (slipping agent masterbatch).

(4) Layer Configuration of Dicing Film

The dicing film of the present invention may have any layer configuration without restriction; the dicing film may have a double-layer configuration consisting of a substrate layer and an adhesive layer or consisting of a substrate layer and an intermediate layer, or a triple-layer configuration consisting of a substrate layer, an intermediate layer, and an adhesive layer laminated in this order. Alternatively, the dicing film may be a laminate of four or more layers including another or other layers such as a low-friction layer in addition to the adhesive layer and the intermediate layer. In the case of a laminate dicing film having an adhesive layer and a low-friction layer in the present invention, preferably the adhesive layer is disposed on one side of the substrate layer while the low-friction layer on the other side. Any other layer may be disposed between the substrate layer and the adhesive layer, between the substrate layer and the intermediate layer, between the intermediate layer and the adhesive layer, or between the substrate layer and the low-friction layer, provided that the advantageous effects of the present invention are not impaired. The substrate layer, intermediate layer, and adhesive layer may each have a multilayer configuration. If multiple substrate layers are disposed, any other layer may be provided between the substrate layers.

Figure 2:
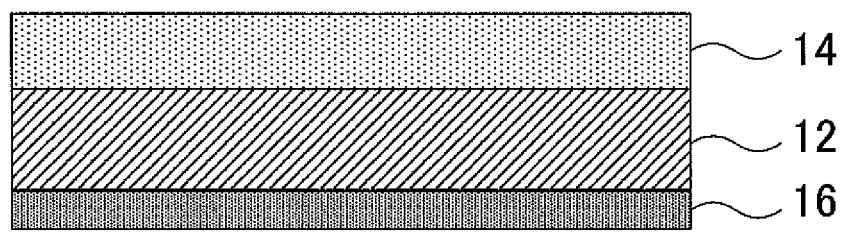
FIG. 2 is a cross-sectional view schematically illustrating an embodiment of a dicing film of the present invention.

FIG. 2 is a schematic cross-sectional view of a dicing film according to an embodiment of the present invention. As shown in FIG. 2, the dicing film includes an expandable substrate layer 12, an adhesive layer 14 disposed on one side of the substrate layer 12 and to be bonded to a wafer, and a low-friction layer 16 disposed on the other side of the substrate layer 12, remote from the adhesive layer 14. The dicing film 10 having such a configuration including the substrate layer 12 has high expandability.

Figure 3:
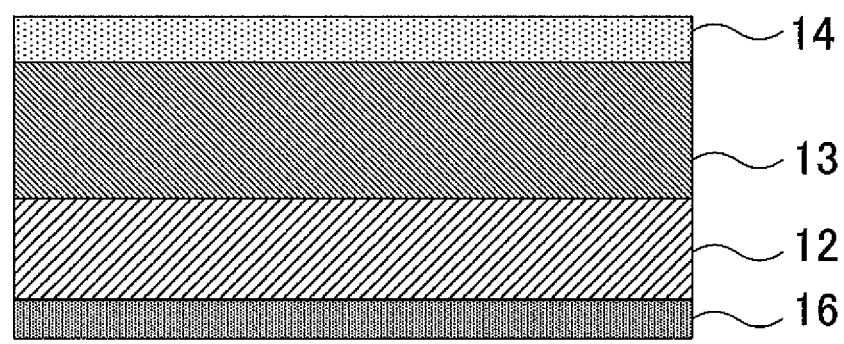
FIG. 3 is a cross-sectional view schematically illustrating another embodiment of the dicing film of the present invention.

FIG. 3 is a schematic cross-sectional view of a dicing film according to another embodiment of the present invention. As shown in FIG. 3, the dicing film includes an expandable substrate layer 12, an intermediate layer 13 disposed on one side of the substrate layer 12 and absorbs irregularities on a wafer, an adhesive layer 14 to be bonded to the wafer, and a low-friction layer 16 disposed on the other side of the substrate layer 12, remote from the adhesive layer 14. The dicing film 10 having such a configuration including the substrate layer 12 has high expandability. The intermediate layer 13 can come into close contact with large irregularities on the wafer when the dicing film is bonded to the semiconductor wafer having the irregularities, resulting in preventing contamination of the wafer surface and damaging of the semiconductor chips during dicing.

A dicing film not including an intermediate layer of the present invention has a total thickness in the range of preferably 50 to 200 µm and more preferably 70 to 150 µm. A dicing film including an intermediate layer between a substrate layer and an adhesive layer of the present invention has a total thickness in the range of preferably 60 to 700 μm and more preferably 80 to 500 μm.

The dicing film of the present invention preferably has a tensile modulus at 23° C. of 70 MPa or more. A tensile modulus less than 70 MPa leads to low handling performance due to wrinkling of the dicing film when the dicing film is bonded to a wafer.

The dicing film of the present invention may further include an optional separator on the surface of the adhesive layer to protect the surface of the adhesive layer. The separator may be composed of paper, or a synthetic resin such as polyethylene, polypropylene, or polyethylene terephthalate. The separator typically has a thickness of about 10 to about 200 μm and preferably about 25 to about 100 μm.

Since the dicing film of the present invention does not contain polyvinyl chloride (PVC) or any other chlorine components, chloride ions creating environmental damage do not occur. Since the dicing film of the present invention contains no plasticizer, the contamination of wafers can be reduced. In addition, the dicing film of the present invention having high expandability barely undergoes necking.

3. Method of Manufacturing Dicing Film

The dicing film of the present invention can be produced by any process. In the case where the dicing film of the present invention is a laminate film including an adhesive layer and a low-friction layer in addition to a substrate layer, the dicing film may be produced through 1) lamination by coextrusion of melt resins constituting individual layers (coextrusion process); 2) lamination of melt resins constituting individual layers on a substrate layer (extrusion lamination process); 3) lamination of films constituting individual layers by thermal compression bonding or with an adhesive (lamination process); or 4) application (coating) of a resin composition constituting an adhesive layer on a substrate layer or on a resin laminate consisting of a substrate layer and an intermediate layer.

Two or more resins can be blended by any process without restriction before extrusion or coextrusion, for example, by dry blend with any of a various types of mixers such as Henschel mixer and tumbler mixer (dry blend process); or by melt blend with a uniaxial extruder or biaxial extruder (melt blend process). Preferred is melt blend with a biaxial extruder.

Any melt blend temperature may be employed suitable for melt blend of resins constituting individual layers. The melt temperature of resin constituting the substrate layer is, for example, in the range of 180 to 260° C. Any extrusion process can be employed, for example, inflation extrusion or T-die extrusion.

In the case where a dicing film is produced by coextrusion of a resin composition constituting the substrate layer and a resin composition constituting the adhesive layer or by extrusion lamination of a resin composition constituting the adhesive layer on the substrate layer, it is preferred that the MFR of the substrate layer at 230° C. and the MFR of the adhesive layer at 230° C. determined in accordance with ASTM D1238 be each in the range of 1 to 20 g/10 min. These layers having such MFR can be shaped to have a uniform thickness.

Similarly, in the case where a dicing film is produced by coextrusion of a resin composition constituting the substrate layer and a resin composition constituting the intermediate layer or by extrusion lamination of a resin composition constituting the intermediate layer on the substrate layer, it is preferred that the MFR of the substrate layer at 230° C. and the MFR of the intermediate layer at 230° C. determined in accordance with ASTM D1238 are each in the range of 1 to 20 g/10 min. These layers having such MFR can be shaped to have a uniform thickness.

Similarly, in the case where a dicing film is produced by coextrusion of a resin composition constituting the substrate layer, a resin composition constituting the intermediate layer, and a resin composition constituting the adhesive layer or by extrusion lamination of a resin composition constituting the intermediate layer and a resin composition constituting the adhesive layer on the substrate layer, it is preferred that the MFR of the substrate layer at 230° C., the MFR of the intermediate layer at 230° C., and the MFR of the adhesive layer at 230° C. determined in accordance with ASTM D1238 are each in the range of 1 to 20 g/10 min. These layers having such MFR can be shaped to have a uniform thickness.

In the case where the adhesive agent constituting the adhesive layer is a radiation-curable adhesive agent, the adhesive agent is preferably applied onto a substrate layer directly or onto a resin laminate of a substrate layer and an intermediate layer followed by drying (coating process described above). The resin laminate of the substrate layer and the intermediate layer can be produced by coextrusion of a resin composition constituting the substrate layer and a resin composition constituting the intermediate layer or by extrusion lamination of a resin composition constituting the intermediate layer onto the substrate layer.

4. Method of Manufacturing Semiconductor Device

The method of manufacturing a semiconductor device using a dicing film of the present invention includes the steps of: 1) bonding the dicing film of the present invention to the rear surface of a semiconductor wafer with an adhesive layer therebetween; 2) dicing the semiconductor wafer; 3) expanding the dicing film and picking up the diced semiconductor wafer pieces (semiconductor chips); and 4) mounting the semiconductor chips to a die pad or the like (not shown) of a semiconductor device by bonding. The dicing film of the present invention has been described above.

Figure 4A:
FIG. 4A illustrates part of a method of manufacturing a semiconductor device using a dicing film according to an embodiment of the present invention.
Figure 4B:
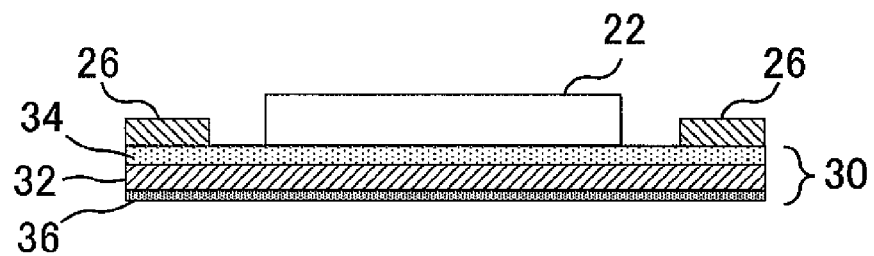
FIG. 4B illustrates part of a method of manufacturing a semiconductor device using a dicing film according to an embodiment of the present invention.

FIGS. 4A to 4E illustrate an example of a method of manufacturing a semiconductor device using a dicing film 30 including a substrate layer 32 provided with an adhesive layer 34 on one surface and a low-friction layer 36 on the other surface thereof. As shown in FIG. 4A, a wafer 22 is provided. As shown in FIG. 4B, the wafer 22 is then bonded to a dicing film 30 of the present invention (step 1 described above). The dicing film 30 has a larger diameter than the wafer 22 such that its periphery can be fixed with a ring frame 26. The periphery of the dicing film 30 is then fixed with the ring frame 26.

Figure 4C:
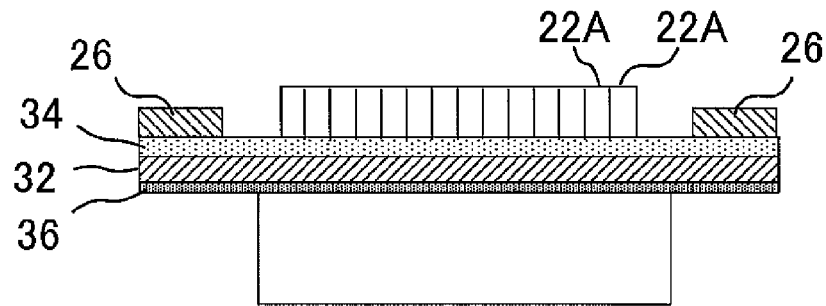
FIG. 4C illustrates part of a method of manufacturing a semiconductor device using a dicing film according to an embodiment of the present invention.

As shown in FIG. 4C, the wafer 22 is diced (cut) into semiconductor chip 22A (step 2 described above). The cut depth can be set so as to reach the interface between the substrate layer 32 and the adhesive layer 34 of the dicing film 30. Cutting may be carried out by any means, for example, with a dicing saw or by laser.

Figure 4D:
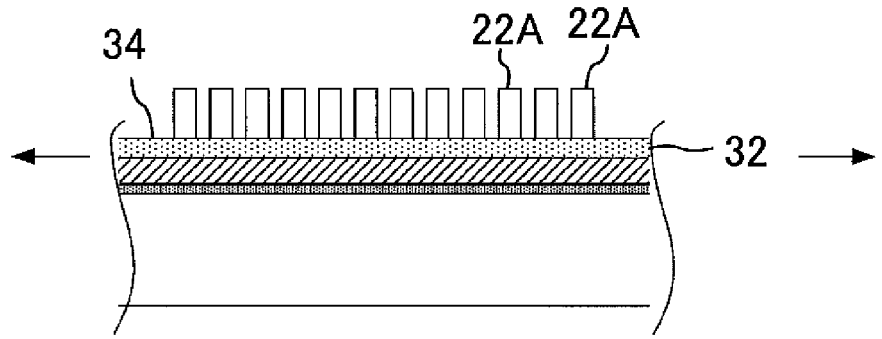
FIG. 4D illustrates part of a method of manufacturing a semiconductor device using a dicing film according to an embodiment of the present invention.

As shown in FIG. 4D, the dicing film 30 is expanded (step 3 described above). Examples of expansion of the dicing film 30 include lifting up a stage of an expander under the dicing film 30 to expand a portion, in contact with the stage, of the dicing film 30 and stretching (extending) the dicing film 30 in a direction parallel to the film plane.

Figure 4E:
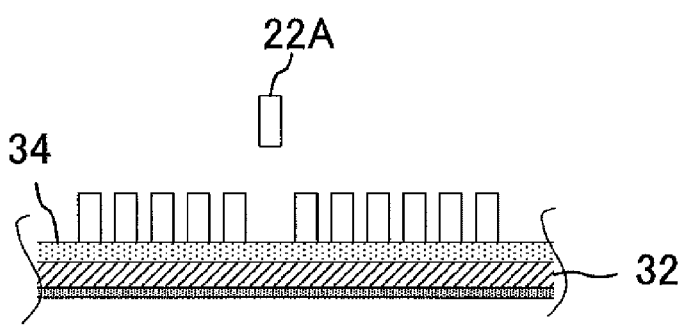
FIG. 4E illustrates part of a method of manufacturing a semiconductor device using a dicing film according to an embodiment of the present invention.

As shown in FIG. 4E, spaces between semiconductor chips 22A produced by dicing can thereby be expanded. Furthermore, expansion of the dicing film 30 generates shear stress between the adhesive layer 34 of the dicing film 30 and the wafer 22. This decreases the adhesive force between the wafer 22 and the adhesive layer 34, and thus facilitates pickup of the semiconductor chips 22A. Through pickup of the semiconductor chips 22A, the semiconductor chips 22A can be separated from the adhesive layer 34 of the dicing film 30.

FIGS. 5A to 5E illustrate an example of a method of manufacturing a semiconductor device using a dicing film 50 including a substrate layer 52 provided with an intermediate layer 53 and the adhesive layer 54 provided in this order on one side and a low-friction layer 56 on the other side thereof.

Figure 5A:
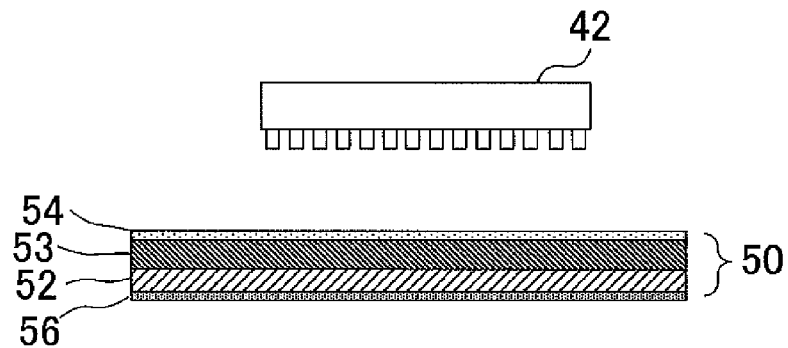
FIG. 5A illustrates part of a method of manufacturing a semiconductor device using a dicing film according to another embodiment of the present invention.

As shown in FIG. 5A, a wafer 42 having surface irregularities such as circuits and the dicing film 50 are provided. The wafer 42 provided with circuits may have a circuit protecting layer to protect the circuits. The circuit protecting layer may be composed of insulating resin, for example, polyimide or polybenzoxazole.

Figure 5B:
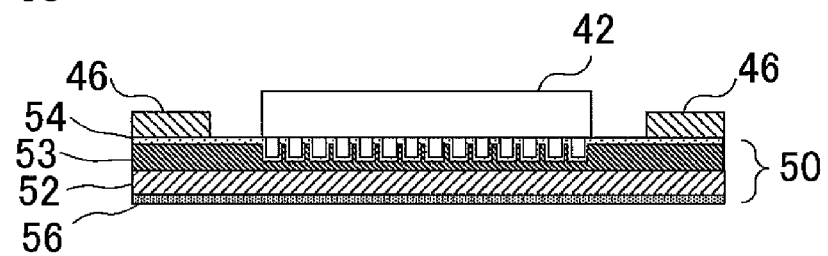
FIG. 5B illustrates part of a method of manufacturing a semiconductor device using a dicing film according to another embodiment of the present invention.

As shown in FIG. 5B, the uneven surface of the wafer 42 is bonded to the dicing film 50 of the present invention under heat (step 1 described above). Bonding may be performed at a temperature of 40° C. to 80° C. and a pressure of 0.3 to 0.5 MPa. At a temperature of less than 40° C., the intermediate layer 53 inevitably has high modulus and thus less absorbs the irregularities. A bonding temperature exceeding 80° C. is undesirable as a process temperature. Bonding of the dicing film 50 may be performed with a known tape bonding machine.

After bonding of the wafer 42, the dicing film 50 may be cooled. Cooling of the dicing film 50 to a temperature below the bonding temperature causes the modulus of the intermediate layer 53 to increase, resulting in satisfactorily close contact between the intermediate layer 53 and the uneven surface of the wafer 42.

The dicing film 50 has a larger diameter than the wafer 42 such that its periphery can be fixed with a ring frame 46. The periphery of the dicing film 50 is then fixed with the ring frame 46.

Figure 5C:
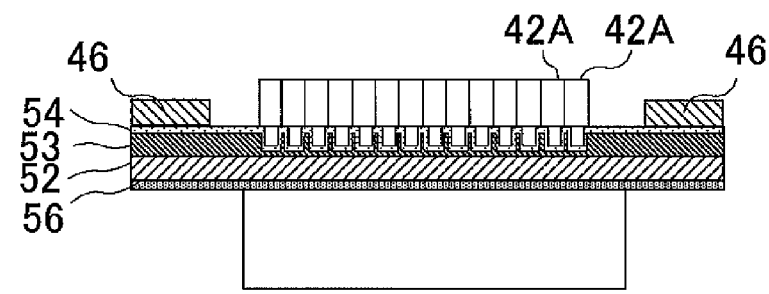
FIG. 5C illustrates part of a method of manufacturing a semiconductor device using a dicing film according to another embodiment of the present invention.

As shown in FIG. 5C, the wafer 42 is diced (cut) into semiconductor chips 42A (step 2 described above). The cut depth can be set so as to reach the interface between the substrate layer 52 and the intermediate layer 53 of the dicing film 50. Cutting may be carried out by any means, for example, with a dicing saw or by laser.

Figure 5D:
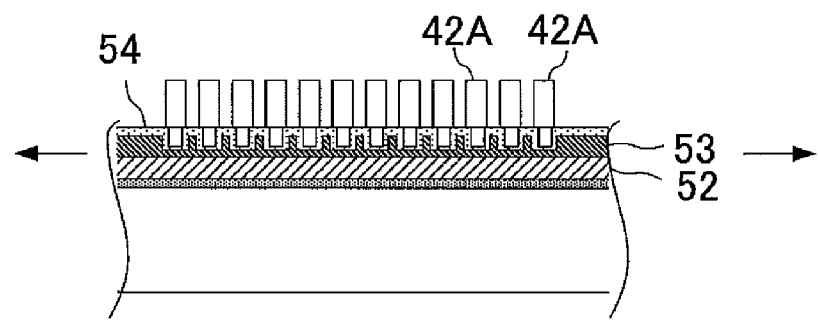
FIG. 5D illustrates part of a method of manufacturing a semiconductor device using a dicing film according to another embodiment of the present invention.

As shown in FIG. 5D, the dicing film 50 is expanded (step 3 described above). Examples of expansion of the dicing film 50 include lifting up a stage of an expander under the dicing film 50 to expand a portion, in contact with the stage, of the dicing film 50, and stretching (extending) the dicing film 50 in a direction parallel to the film plane.

Figure 5E:
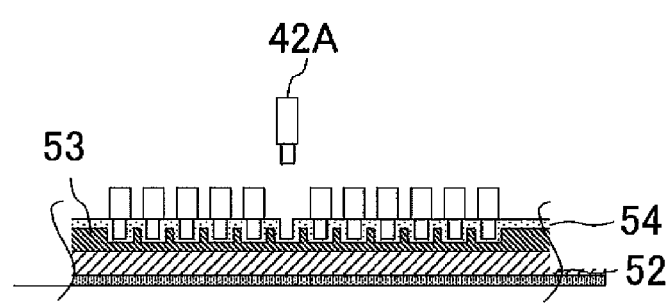
FIG. 5E illustrates part of a method of manufacturing a semiconductor device using a dicing film according to another embodiment of the present invention.

As shown in FIG. 5E, spaces between semiconductor chips 42A produced by dicing can thereby be expanded. Furthermore, expansion of the dicing film 50 generates shear stress between the adhesive layer 54 of the dicing film 50 and the wafer 42. This decreases the adhesive force between the wafer 42 and the adhesive layer 54, and thus facilitates pickup of the semiconductor chips 42A. Through pickup of the semiconductor chips 42A, the semiconductor chips 42A can be separated from the adhesive layer 54 of the dicing film 50.

EXAMPLES (1) 1-Butene-α-olefin Copolymer (A)

1-Butene-α-olefin copolymer (A1) (trade name: Tafmer BL4000, available from Mitsui Chemicals, Inc.), 1-butene-α-olefin copolymer (A2) (trade name: Tafmer BL3450, available from Mitsui Chemicals, Inc.), and 1-butene-α-olefin copolymer (A3) (trade name: Tafmer BL2481, available from Mitsui Chemicals, Inc.) shown in Table 1 were used as 1-butene-α-olefin copolymers (A) contained in a substrate layer.

The density, tensile modulus, and MFR of the 1-butene-α-olefin copolymers (A1) to (A3) were determined as follows: The results are shown in Table 1.

1) Measurement of Density

The density was determined by a density gradient tube method disclosed in Japanese Unexamined Patent Application Publication No. 2001-33372. Specifically, a produced 1-butene-α-olefin copolymer sample was melted with a melt indexer to form a strand. After the strand is annealed, it was cut into a proper size which was then put into a density gradient tube.

The density gradient tube consisted of a glass cylinder that was filled with liquid having a continuous density gradient. The density of the solid sample of the put 1-butene-α-olefin copolymer was determined from an equilibrium position at which the sample got still in the liquid. The glass cylinder was filled with a mixed solution of ethanol and water in accordance with Table 2 in JIS K7112.

2) Measurement of Tensile Modulus

A film composed of 1-butene-α-olefin copolymer (A) was prepared. The tensile modulus of the film was determined in accordance with ASTM D638. Specifically, i) a 100 μm thick film was cut into a strip specimen having a width (TD direction) of 10 mm and a length (MD direction) of 100 mm; and ii) the tensile modulus of the specimen was determined with a tensilometer at a distance between chucks of 50 mm and a tensile rate of 300 mm/min in accordance with JIS K7161. The tensile modulus was measured at a temperature of 23° C. and a relative humidity of 55%.

3) Measurement of MFR

The MFR of the 1-butene-α-olefin copolymer (A) was measured at a temperature of 190° C. or 230° C. and a load of 2.16 kg in accordance with ASTM D1238.

TABLE 1

|  |  | A1 | A2 | A3 |
|---|---|---|---|---|
| Copolymer | Trade name | Tafmer BL4000 | Tafmer BL3450 | Tafmer BL2481 |
| Properties | Density (kg/m$^3$) | 915 | 900 | 900 |
|  | Tensile modulus (MPa) | 430 | 200 | 180 |
|  | MFR(190° C.) (g/10 min) | 1.8 | 4.0 | 4.0 |
|  | MFR(230° C.) (g/10 min) | 4.8 | 10 | 8.0 |

(2) Propylenic Elastomer Composition (B)

Synthesis of propylene-α-olefin Copolymer (b1)

Synthesis Example 1

After 833 ml of dry hexane, 100 g of 1-butene, and 1.0 mmol of triisobutylaluminum at normal temperature were fed into a 2000 ml polymerization vessel thoroughly purged with nitrogen, the polymerization vessel was heated to 40° C. and then was pressurized with propylene into 0.76 MPa. After the polymerization vessel was pressurized with ethylene into 0.8 MPa, a toluene solution containing 0.001 mmol of dimethylmethylene (3-tert-butyl-5-methylcyclopentadienyl)fluorenylzirconium dichloride and 0.3 mmol of methylaluminoxane (available from Tosoh Finechem Corporation) on the basis of aluminum was placed into the polymerization vessel. Polymerization was carried out for 20 minutes at an internal temperature of 40° C. while the internal pressure was maintained at 0.8 MPa with ethylene, and then 20 ml of methanol was added to quench the reaction. After releasing the pressure, the polymerization solution was poured into 2 L of methanol to precipitate the polymer, which was then dried for 12 hours at 130° C. under vacuum to yield 36.4 g of propylene-α-olefin copolymer (b1-1).

Synthesis Examples 2 to 4

Propylene-α-olefin copolymers (b1-2) to (b1-4) were prepared as in Synthesis Example 1 except that the proportion of propylene, ethylene, and 1-butene was changed as shown in Table 2.

The compositions of propylene-α-olefin copolymers (b1-1) to (b1-4) prepared in Synthesis Examples 1 to 4 are summarized in Table 2. The results are shown in Table 2.

TABLE 2

|  |  |  | Synthesis Example 1 (b1-1) | Synthesis Example 2 (b1-2) | Synthesis Example 3 (b1-3) | Synthesis Example 4 (b1-4) |
|---|---|---|---|---|---|---|
| Composition | Propylene |  | 67 | 70 | 60 | 75 |
|  | α-olefin | Ethylene | 14 | 10 | 16 | 18 |
|  |  | 1-Butene | 19 | 20 | 24 | 7 |

Preparation of Propylenic Elastomer Composition (B)

Synthesis Example 5

80 weight parts of propylene-α-olefin copolymer (b1-2) prepared in Synthesis Example 2 and 20 weight parts of homopolypropylene (b2) were kneaded with a biaxial extruder at 200° C. to prepare a propylenic elastomer (B1).

Synthesis Example 6

A propylenic elastomer composition (B2) was prepared as in Synthesis Example 5, except that 85 weight parts of propylene-α-olefin copolymer (b1-3) prepared in Synthesis Example 3 and 15 weight parts of polypropylene (b2) were kneaded.

Synthesis Example 7

A propylenic elastomer composition (B3) was prepared as in Synthesis Example 5, except that 90 weight parts of propylene-α-olefin copolymer (b1-4) prepared in Synthesis Example 4 and 10 weight parts of polypropylene (b2) were kneaded.

Synthesis Example 8

A propylenic elastomer composition (B4) was prepared as in Synthesis Example 5, except that 80 weight parts of propylene-α-olefin copolymer (b1-1) prepared in Synthesis Example 1 and 20 weight parts of polypropylene (b2) were blended.

Synthesis Example 9

70 weight parts of propylene-α-olefin copolymer (b1-2) prepared in Synthesis Example 2 and 30 weight parts of homopolypropylene (b2) were kneaded with a biaxial extruder at 200° C. to prepare a propylenic elastomer (B5).

Synthesis Example 10

60 weight parts of propylene-α-olefin copolymer (b1-2) prepared in Synthesis Example 2 and 40 weight parts of homopolypropylene (b2) were kneaded with a biaxial extruder at 200° C. to prepare a propylenic elastomer (B6).

Synthesis Example 11

50 weight parts of propylene-α-olefin copolymer (b1-2) prepared in Synthesis Example 2 and 50 weight parts of homopolypropylene (b2) were kneaded with a biaxial extruder at 200° C. to prepare a propylenic elastomer (B7).

Synthesis Example 12

30 weight parts of propylene-α-olefin copolymer (b1-2) prepared in Synthesis Example 2 and 70 weight parts of homopolypropylene (b2) were kneaded with a biaxial extruder at 200° C. to prepare a propylenic elastomer (B8).

Synthesis Example 13

20 weight parts of propylene-α-olefin copolymer (b1-2) prepared in Synthesis Example 2 and 80 weight parts of homopolypropylene (b2) were kneaded with a biaxial extruder at 200° C. to prepare a propylenic elastomer (39).

The density, tensile modulus, and MFR of the resulting propylenic elastomer compositions (B1) to (B9) were determined in the manners described above. The results are shown in Table 3.

TABLE 3

|  |  |  | Synthesis Example 5 (B1) | Synthesis Example 6 (B2) | Synthesis Example 7 (B3) | Synthesis Example 8 (B4) | Synthesis Example 9 (B5) | Synthesis Example 10 (B6) | Synthesis Example 11 (B7) | Synthesis Example 12 (B8) | Synthesis Example 13 (B9) |
|---|---|---|---|---|---|---|---|---|---|---|---|
| Composition | Propylene-α-olefin copolymer (b1) | Type | (b1-2) | (b1-3) | (b1-4) | (b1-1) | (b1-2) | (b1-2) | (b1-2) | (b1-2) | (b1-2) |
|  |  | Content (weight parts) | 80 | 85 | 90 | 80 | 70 | 60 | 50 | 30 | 20 |
|  | Polypropylene | Type | (b2) | (b2) | (b2) | (b2) | (b2) | (b2) | (b2) | (b2) | (b2) |

TABLE 3-continued

|  |  |  | Synthesis Example 5 (B1) | Synthesis Example 6 (B2) | Synthesis Example 7 (B3) | Synthesis Example 8 (B4) | Synthesis Example 9 (B5) | Synthesis Example 10 (B6) | Synthesis Example 11 (B7) | Synthesis Example 12 (B8) | Synthesis Example 13 (B9) |
|---|---|---|---|---|---|---|---|---|---|---|---|
|  | (b2) | Content (weight parts) | 20 | 15 | 10 | 20 | 30 | 40 | 50 | 70 | 80 |
| Physical properties | Density (kg/m$^3$) |  | 868 | 866 | 868 | 867 | 866 | 868 | 867 | 867 | 867 |
|  | Tensile modulus (MPa) |  | 42 | 12 | 25 | 16 | 60 | 90 | 160 | 420 | 700 |
|  | MFR(230° C.) (g/10 min) |  | 4 | 6 | 6 | 7 | 6 | 6 | 7 | 7 | 7 |

Example 1

Formation of Film

A 60/40 mixture on the mass basis of the 1-butene-α-olefin copolymer (A1) and propylenic elastomer composition (B1) described above were prepared as raw materials for a substrate layer. A linear low-density polyethylene, trade name: Evolue SP2040 (available from Prime Polymer Co., Ltd., Vicat softening point: 101° C.) was provided as a raw material for a low-friction layer. NOTIO PN3560 (trade name, available from Mitsui Chemicals, Inc., MFR: 4 g/10 min at 230° C. in accordance with ASTM D1238) was provided as a raw material for an adhesive layer.

Formation of Laminate Film

The raw materials for the substrate layer, low-friction layer, and adhesive layer were put into respective extruders provided with full-flight screws to be melt-kneaded. The melt materials for the substrate layer, low-friction layer, and adhesive layer were coextruded at an extrusion temperature of 230° C. from a multilayer die into a laminate film having a triple-layer structure consisting of a low-friction layer, a substrate layer, and an adhesive layer in this order. After a separator (Mitsui Chemicals Tohcello Inc., trade name SP-PET) is further laminated on the adhesive layer of the resulting laminate film, the film was slit into a predetermined width which was rolled up.

Examples 2 to 3

Laminate films were prepared as in Example 1 except that the proportion of the 1-butene-α-olefin copolymer (A1) and the propylenic elastomer composition (B1) in the substrate layer was changed as shown in Table 4.

Example 4

A laminate film was prepared as in Example 1 except that the propylenic elastomer composition (B1) was replaced with a propylenic elastomer composition (B2) in the substrate layer.

Examples 5 to 6

Laminate films were prepared as in Example 1 except that the proportion of the 1-butene-α-olefin copolymer (A1) and the propylenic elastomer composition (B2) in the substrate layer was changed as shown in Table 4.

Example 7

A laminate film was prepared as in Example 1 except that the proportion of the 1-butene-α-olefin copolymer (A1) and the propylene-α-olefin copolymer (b1-4) in the substrate layer was changed as shown in Table 5.

Example 8

A laminate film was prepared as in Example 1 except that the raw material, NOTIO PN3560, for the adhesive layer is replaced with a linear low-density polyethylene, Evolue SP2040 (trade name, available from Prime Polymer Co., Ltd.).

Example 9

A laminate film was prepared as in Example 4 except that the raw material, NOTIO PN3560, for the adhesive layer is replaced with a linear low-density polyethylene, Evolue SP2040 (trade name, available from Prime Polymer Co., Ltd.).

Example 10

A double-layer laminate film consisting of a substrate layer and an adhesive layer was prepared as in Example 1 except that the linear low-density polyethylene, Evolue SP 2040 (available from Prime Polymer Co., Ltd.) for the low-friction layer is replaced with the same material for the substrate layer.

Example 11

A laminate film having a double layer structure was prepared as in Example 10 except that the raw material, NOTIO PN3560, for the adhesive layer is replaced with NOTIO PN2060 (registered trade mark, available from Mitsui Chemicals, Inc., MFR: 7 g/10 min at 230° C. in accordance with ASTM D1238).

Example 12

A laminate film having a double layer structure was prepared as in Example 10 except that the raw material, NOTIO PN3560, for the adhesive layer is replaced with a hydrogenated styrene-butadiene rubber (HSBR), DYNARON DR1322P (registered trade mark, available from JSR Corporation).

Example 13

Preparation of UV-Curable Adhesive Coating Solution for Forming UV-Curable Adhesive Layer Ethyl acrylate (48 weight parts), 2-ethylhexyl acrylate (27 weight parts), methyl acrylate (20 weight parts), glycidyl methacrylate (5 weight parts), and benzoyl peroxide (0.5 part by weight) as a polymerization initiator were mixed. The mixture was added dropwise with stirring into a nitrogen-purged flask charged with toluene (65 weight parts) and ethyl acetate (50 weight parts) at 80° C. over 5 hours, and was further stirred for 5 hours to complete the reaction. After the reaction, the solution was cooled. Xylene (25 weight parts), acrylic acid (2.5 weight parts), and tetradecylbenzylammonium chloride (1.5 weight parts) were added, and the mixture was reacted at 80° C. for 10 hours while air was blew to yield a solution of an acrylic ester copolymer having photopolymerizable carbon-carbon double bonds.

To the solution, 7 weight parts of benzoin as a photoinitiator, 2 weight parts of an isocyanate cross-linking agent, OLESTER P49-75S (trade name, available from Mitsui Chemicals, Inc.), 15 weight parts of dipentaerythritol hexaacrylate, AronixbM-400 (trade name, available from Toagosei Co. Ltd.) as a low-molecular weight compound having two or more photopolymerizable carbon-carbon double bonds per molecule were added relative to 100 weight parts of the copolymer (solid component) to yield a UV-curable adhesive coating solution.

Lamination of UV Adhesive Layer

The UV-curable adhesive coating solution was applied onto a release-treated (silicone-treated) side of a 38 μm thick PET releasing film (available from TOHCELLO Co., Ltd., trade name SP-PET) with a comma coater, and was dried at 120° C. for 4 minutes to yield a UV-curable adhesive layer having a thickness of 30 μm. A substrate film which was the same as that used in Example 10 but had a corona-treated side was prepared. The UV-curable adhesive layer formed on the PET film and the corona-treated side of the substrate film were press-bonded with a dry laminator to transfer the UV-curable adhesive layer onto the corona-treated side of the substrate film to yield a laminate film.

Example 14

A laminate film was prepared as in Example 1 except that the raw material for the low-friction layer, linear low-density polyethylene Evolue SP2040 (available from Prime Polymer Co., Ltd.) was replaced with an ethylene-methacrylic acid copolymer NUCREL AN4213C (trade name, available from DUPONT-MITSUI POLYCHEMICALS CO., LTD, MFR: 10 g/10 min at 190° C. in accordance with JIS K7210 1999).

Example 15

A laminate film was prepared as in Example 1 except that the raw material for the low-friction layer, linear low-density polyethylene Evolue SP2040 (available from Prime Polymer Co., Ltd.) was replaced with an ethylene-methacrylic acid copolymer NUCREL N1108C (trade name, available from DUPONT-MITSUI POLYCHEMICALS CO., LTD, MFR: 8 g/10 min at 190° C. in accordance with JIS K7210 1999).

Example 16

A laminate film was prepared as in Example 1 except that both the raw material for the low-friction layer, linear low-density polyethylene Evolue SP2040 (available from Prime Polymer Co., Ltd.) and the raw material for the adhesive layer, NOTIO PN3560 were replaced with an ethylene-methacrylic acid copolymer NUCREL AN4213C (trade name, available from DUPONT-MITSUI POLYCHEMICALS CO., LTD, MFR: 10 g/10 min at 190° C. in accordance with JIS K7210 1999).

Example 17

A laminate film was prepared as in example 10 except that the propylenic elastomer composition (B1) in the substrate layer is replaced with a propylenic elastomer composition (B3).

Example 18

A laminate film was prepared as in example 10 except that the propylenic elastomer composition (B1) in the substrate layer is replaced with a propylenic elastomer composition (B4).

Comparative Example 1

A laminate film was prepared as in example 1 except that only a 1-butene-α-olefin copolymer (A1) was used as a raw material for the substrate layer.

Comparative Example 2

A laminate film was prepared as in example 1 except that only a 1-butene-α-olefin copolymer (A2) was used as a raw material for the substrate layer.

Comparative Example 3

A laminate film was prepared as in example 1 except that only a 1-butene-α-olefin copolymer (A3) was used as a raw material for the substrate layer.

Comparative Example 4

A laminate film was prepared as in example 1 except that the proportion of the 1-butene-α-olefin copolymer (A1) to the propylenic elastomer composition (B1) in the substrate layer was changed to 80/20.

Comparative Example 5

A laminate film was prepared as in example 1 except that the proportion of the 1-butene-α-olefin copolymer (A1) to the propylenic elastomer composition (B2) in the substrate layer was changed to 80/20.

Comparative Example 6

A laminate film was prepared as in example 1 except that the proportion of the 1-butene-α-olefin copolymer (A1) to the propylenic elastomer composition (B2) in the substrate layer was changed to 20/80.

Comparative Example 7

A laminate film was prepared as in example 2 except that the propylenic elastomer composition (B1) in the substrate layer was replaced with an ethylene-α-olefin copolymer Tafmer P0275 (available from Mitsui Chemicals, Inc.).

Comparative Example 8

A laminate film was prepared as in example 2 except that the propylenic elastomer composition (B1) in the substrate layer was replaced with SEBS (registered trade mark: DYNARON DR8601P, available from JSR Corporation).

Comparative Example 9

A laminate film was prepared as in example 2 except that the propylenic elastomer composition (B1) in the substrate layer was replaced with hydrogenated styrene-butadiene rubber (registered trade mark: DYNARON DR1322P, available from JSR Corporation).

Comparative Example 10

A mixture (30/70 by mass) of homopolypropylene, h-PP (available from Prime Polymer Co., Ltd. trade name F107PV) and low-density polyethylene, LDPE (available from Prime Polymer Co., Ltd., trade name: Milason 11P) was extruded from an extruder equipped with a flight screw at an extruding temperature of 230° C. to yield a monolayer film.

Comparative Example 11

A mixture (30/10/60 by mass) of high-density polyethylene, HDPE (available from Prime Polymer Co., Ltd., trade name Hi-Zex 2100J), ethylene-propylene rubber, EPR (available from Mitsui Chemicals, Inc., trade name P0275), and random polypropylene, r-PP (available from Prime Polymer Co., Ltd., trade name F327) was extruded from an extruder equipped with a flight screw at an extruding temperature of 230° C. to yield a monolayer film.

Comparative Example 12

A mixture (20/10/70 by mass) of homopolypropylene h-PP (available from Prime Polymer Co., Ltd., trade name F107PV), ethylene-propylene rubber, EPR (available from Mitsui Chemicals, Inc., trade name P0275), and ethylene-methacrylic acid copolymer, EMAA (DUPONT-MITSUI POLYCHEMICALS CO., LTD, trade name N1108C) was extruded from an extruder equipped with a flight screw at an extruding temperature of 230° C. to yield a monolayer film.

The films prepared in Examples and Comparative Examples were subjected to evaluation of 1) expandability, 2) ease of necking, and 3) handling performance, as described below. These films are also subjected to evaluation of 4) adhesive force of the adhesive layer, as described below. The films of some of the Examples were subjected to 5) TEM observation.

1) Expandability of Film

After the separator was detached from each film, the adhesive layer of the film was put into tight contact with an 8-inch ring frame with a rubber roller. Non-adhesive films (Examples 8 and 9, Comparative Examples 10, 11, and 12) were each fixed to a ring frame with a double-sided adhesive tape (Nicetack, Nichiban Co., Ltd.).

Figure 6A:
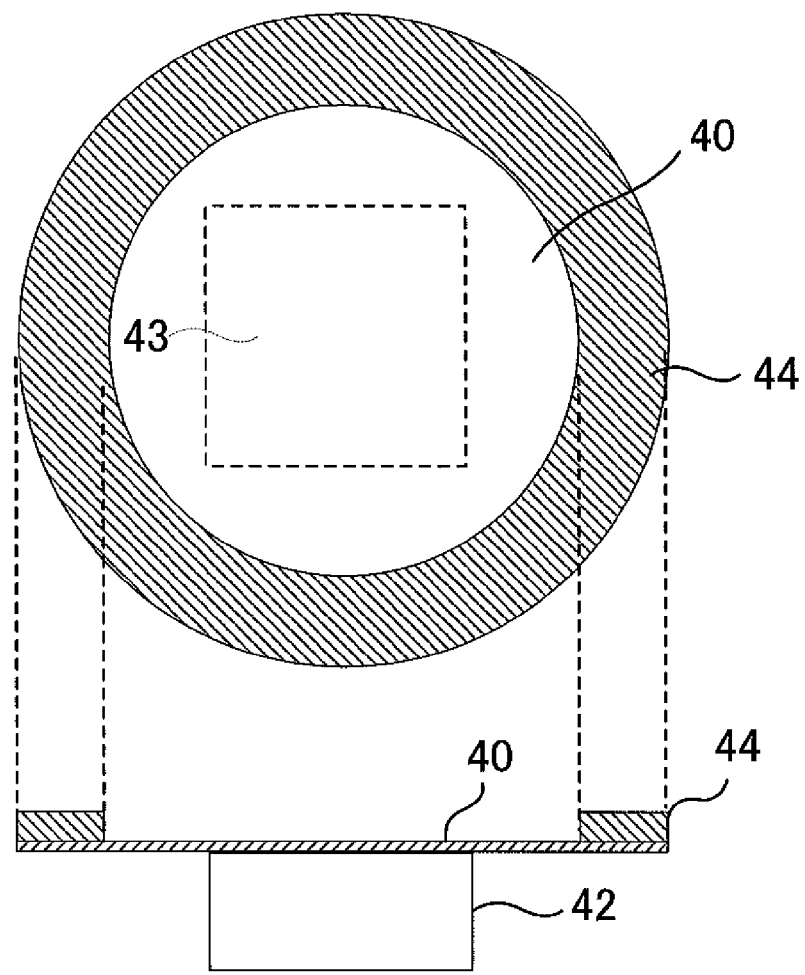
FIG. 6A includes a top view and a side view illustrating a method of expanding a laminate film according to an embodiment.

A Grid pattern consisting of 2-cm squares was written with a permanent marker on the surface of the low-friction layer, which enhanced slippage of the film. The grid pattern was 12 cm in length in MD and TD directions. As shown in FIG. 6A, the ring frame 44 was fixed to an expander such that the surface of the substrate layer of the film 40 came into contact with the stage 43 of the expander. The expander used was HS-1800 made by Hugle Electronics Inc.

Figure 6B:
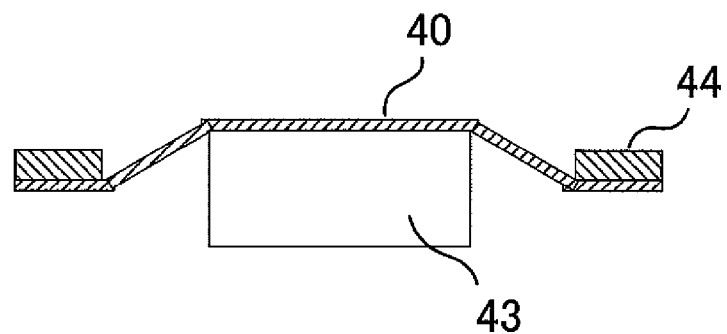
FIG. 6B is a side view illustrating a method of expanding a laminate film according to an embodiment.

As shown in FIG. 6B, the stage 43 of the expander was lifted up by 65 mm to measure the lengths of the grid in the TD and MD directions after the film 40 was expanded. The observed values were inserted into the following equation to determine the expansion rate and anisotropy of the expansion rate.

Expansion rate($MD$ and $TD$ directions)(%)=100× (length of grid after expansion)/(length of grid before expansion)

Anisotropy of expansion rate=Abs|(expansion rate in $MD$ direction)−(expansion rate in $TD$ direction)|

This expansion rate indicates an expansion rate of the expandable adhesive film on the stage. Since the stage was lifted up by 65 mm for all the films as described above, a film having a low expansion rate represents that was is not sufficiently expanded on the stage but was expanded between the edges of the stage and the ring frame. The expansion rate thus corresponds to expandability required for dicing steps involving picking up of semiconductor chips simulated by the grid pattern.

2) Tendency to Necking

The tendency to necking of a film during expansion was evaluated by the occurrence of clouding at a portion in contact with a stage and a portion in contact with an edge of the stage in accordance with the following ranks:

○: No necking was observed
x: Necking was observed

3) Handling Performance

The handling performance of the film was evaluated based on the tensile modulus of a film. In detail, the film was cut into a strip specimen having a width (TD direction) of 10 mm and a length (MD direction) of 100 mm. The tensile modulus of the specimen was measured with a tensilometer at a tensile rate of 300 min/min in accordance with HS K7161 with a chuck-to-chuck distance of 50 mm. The tensile modulus was the average of five specimens at a temperature of 23° C. and a humidity of 55% for each film.

x: A tensile modulus of the overall film of less than 70 MPa or more than 170 MPa.
○: A tensile modulus of the overall film in the range of 70 MPa to 170 MPa.

4) Adhesive Force

The adhesive force of the resulting films (a coextruded film with an adhesive layer, and a UV-curable film with an adhesive layer) was measured at a temperature of 23° C. and a relative humidity of 50% in accordance with JIS Z0237. The films were each bonded to a stainless steel-BA plate under a pressure of about 2 kg with a rubber roller, and allowed to stand for 30 minutes in a constant environment at a temperature of 23° C. and a relative humidity of 50%. The adhesive force was then measured when the film was peeled off from the stainless steel-BA plate at a peeling rate of 300 mm/min in the direction perpendicular to a surface of the plate. The measurement of the adhesive force was repeated twice. The average measured for two test pieces having a width of 25 mm was defined as "adhesive force (N/25 nm)".

The low-friction layers, substrate layers, and adhesive layers used in Examples and Comparative Examples were subjected to determination of tensile modulus and MFR, in the manner described above. In Tables, the term "tensile modulus (A/B)" indicates the tensile modulus of the substrate layer. Table 4 shows the results of Examples 1 to 6; Table 5 the results of Examples 7 to 12; and Table 6 the results of Examples 13 to 18. Table 7 shows the results of Comparative Examples 1 to 6; Table 8 the results of Comparative Examples 7 to 9; and Table 9 the results of Comparative Examples 10 to 12.

TABLE 4

| | | | Example 1 | Example 2 | Example 3 | Example 4 | Example 5 | Example 6 |
|---|---|---|---|---|---|---|---|---|
| Sheet configuration | Low friction layer | Type of resin | Evolue SP2040 | Evolue SP2040 | Evolue SP2040 | Evolue SP2040 | Evolue SP2040 | Evolue SP2040 |
| | | Tensile modulus (MPa) | 105 | 105 | 105 | 105 | 105 | 105 |
| | | MFR at 230° C. (g/10 min) | 3.8 | 3.8 | 3.8 | 3.8 | 3.8 | 3.8 |
| | | Thickness (μm) | 8 | 8 | 8 | 8 | 8 | 8 |
| | Substrate layer | 1-Butene-α-olefin copolymer (A) | A1 | A1 | A1 | A1 | A1 | A1 |
| | | Tensile modulus (A) (MPa) | 430 | 430 | 430 | 430 | 430 | 430 |
| | | Density (kg/m³) | 915 | 915 | 915 | 915 | 915 | 915 |
| | | MFR at 230° C. (g/10 min) | 4.8 | 4.8 | 4.8 | 4.8 | 4.8 | 4.8 |
| | | Propylenic elastomer composition (B) | B1 | B1 | B1 | B2 | B2 | B2 |
| | | Tensile modulus (B) (MPa) | 42 | 42 | 42 | 12 | 12 | 12 |
| | | Density (kg/m³) | 868 | 868 | 868 | 866 | 866 | 866 |
| | | MFR at 230° C. (g/10 min) | 4 | 4 | 4 | 6 | 6 | 6 |
| | | Mixing ratio A/B | 60/40 | 50/50 | 40/60 | 60/40 | 50/50 | 40/60 |
| | | Tensile modulus (A/B) (MPa) | 275 | 236 | 197 | 263 | 221 | 179 |
| | | Thickness (μm) | 64 | 60 | 64 | 64 | 64 | 64 |
| | Adhesive layer | Type of resin | PN3560 | PN3560 | PN3560 | PN3560 | PN3560 | PN3560 |
| | | Tensile modulus (MPa) | 12 | 12 | 12 | 12 | 12 | 12 |
| | | MFR at 230° C. (g/10 min) | 6 | 6 | 6 | 6 | 6 | 6 |
| | | Adhesive force (N/25 mm) | 3.0 | 3.0 | 3.0 | 3.0 | 3.0 | 3.0 |
| | | Thickness (μm) | 12 | 12 | 12 | 12 | 12 | 12 |
| Evaluation | Expansion rate | MD direction (%) | 132 | 135 | 133 | 128 | 142 | 129 |
| | | TD direction (%) | 130 | 132 | 135 | 127 | 142 | 130 |
| | Anisotropy (%) of expansion rate | | 2.0 | 3.0 | 2.0 | 1.0 | 0.0 | 1.0 |
| | Necking | Portion in contact with Stage | ○ | ○ | ○ | ○ | ○ | ○ |
| | | Portion in contact with Edge of Stage | ○ | ○ | ○ | ○ | ○ | ○ |
| | Handling performance | Tensile modulus (MPa) | 120 | 110 | 80 | 115 | 100 | 75 |
| | | | ○ | ○ | ○ | ○ | ○ | ○ |

TABLE 5

| | | | Example 7 | Example 8 | Example 9 | Example 10 | Example 11 | Example 12 |
|---|---|---|---|---|---|---|---|---|
| Sheet configuration | Low friction layer | Type of resin | Evolue SP2040 | Evolue SP2040 | Evolue SP2040 | Same as substrate layer | Same as substrate layer | Same as substrate layer |
| | | Tensile modulus (MPa) | 105 | 105 | 105 | | | |
| | | MFR at 230° C. (g/10 min) | 3.8 | 3.8 | 3.8 | | | |
| | | Thickness (μm) | 8 | 8 | 8 | 8 | 8 | 8 |
| | Substrate layer | 1-Butene-α-olefin copolymer (A) | A1 | A1 | A1 | A1 | A1 | A1 |
| | | Tensile modulus (A) (MPa) | 430 | 430 | 430 | 430 | 430 | 430 |
| | | Density (kg/m³) | 915 | 915 | 915 | 915 | 915 | 915 |
| | | MFR at 230° C. (g/10 min) | 4.8 | 4.8 | 4.8 | 4.8 | 4.8 | 4.8 |
| | | Propylenic elastomer composition (B) | Synthesis Example b1-4 | B1 | B2 | B1 | B1 | B1 |
| | | Tensile modulus (B) (MPa) | 10 | 42 | 12 | 42 | 42 | 42 |
| | | Density (kg/m³) | 860 | 868 | 866 | 868 | 868 | 868 |
| | | MFR at 230° C. (g/10 min) | 5 | 4 | 6 | 4 | 4 | 4 |
| | | Mixing ratio A/B | 60/40 | 60/40 | 60/40 | 60/40 | 60/40 | 60/40 |
| | | Tensile modulus (A/B) (MPa) | 262 | 275 | 263 | 275 | 275 | 275 |
| | | Thickness (μm) | 64 | 64 | 64 | 64 | 64 | 64 |
| | Adhesive layer | Type of resin | Evolue SP2040 | Evolue SP2040 | Evolue SP2040 | PN3560 | PN2060 | DYNARON DR1322P |
| | | Tensile modulus (MPa) | 105 | 105 | 105 | 12 | 25 | 1.8 |
| | | MFR at 230° C. (g/10 min) | 3.8 | 3.8 | 3.8 | 6 | 6 | 4 |
| | | Adhesive force (N/25 mm) | No adhesion | No adhesion | No adhesion | 6.0 | 4.0 | 1.8 |
| | | Thickness (μm) | 12 | 12 | 12 | 12 | 12 | 12 |
| Evaluation | Expansion rate | MD direction (%) | 125 | 132 | 129 | 139 | 139 | 129 |
| | | TD direction (%) | 127 | 129 | 128 | 139 | 140 | 129 |
| | Anisotropy (%) of expansion rate | | 2.0 | 3.0 | 1.0 | 0.0 | 1.0 | 0.0 |
| | Necking | Portion in contact with Stage | ○ | ○ | ○ | ○ | ○ | ○ |
| | | Portion in contact with Edge of Stage | ○ | ○ | ○ | ○ | ○ | ○ |
| | Handling performance | Tensile modulus (MPa) | 128 | 134 | 124 | 123 | 123 | 122 |
| | | | ○ | ○ | ○ | ○ | ○ | ○ |

TABLE 6

| | | | Example 13 | Example 14 | Example 15 | Example 16 | Example 17 | Example 18 |
|---|---|---|---|---|---|---|---|---|
| Sheet configuration | Low friction layer | Type of resin | The same as substrate layer | NUCREL AN4213C | NUCREL N1108C | NUCREL AN4213C | Same as substrate layer | Same as substrate layer |
| | | Tensile modulus (MPa) | | 28 | 26 | 28 | | |
| | | MFR at 230° C. (g/10 min) | | 18 | 14 | 18 | | |
| | | Thickness (μm) | 8 | 8 | 8 | 8 | 8 | 8 |
| | Substrate layer | 1-Butene-α-olefin copolymer (A) | A1 | A1 | A1 | A1 | A1 | A1 |
| | | Tensile modulus (A) (MPa) | 430 | 430 | 430 | 430 | 430 | 430 |
| | | Density (kg/m³) | 915 | 915 | 915 | 915 | 915 | 915 |
| | | MFR at 230° C. (g/10 min) | 4.8 | 4.8 | 4.8 | 4.8 | 4.8 | 4.8 |
| | | Propylenic elastomer composition (B) | B1 | B1 | B1 | B1 | B3 | B4 |
| | | Tensile modulus (B) (MPa) | 42 | 42 | 42 | 42 | 25 | 16 |
| | | Density (kg/m³) | 868 | 868 | 868 | 868 | 868 | 867 |
| | | MFR at 230° C. (g/10 min) | 4 | 4 | 4 | 4 | 4 | 4 |
| | | Mixing ratio A/B | 60/40 | 60/40 | 60/40 | 60/40 | 60/40 | 60/40 |
| | | Tensile modulus (A/B) (MPa) | 275 | 275 | 275 | 275 | 220 | 190 |
| | | Thickness (μm) | 64 | 64 | 64 | 64 | 64 | 64 |
| | Adhesive layer | Type of resin | UV-curable | PN3560 | PN3560 | NUCREL AN4213C | PN3560 | PN3560 |
| | | Tensile modulus (MPa) | 0.3 | 12 | 12 | 28 | 12 | 12 |
| | | MFR at 230° C. (g/10 min) | — | 6 | 6 | 18 | 6 | 6 |
| | | Adhesive force (N/25 mm) | 3.2 | 6.0 | 6.0 | 4.0 | 6.0 | 6.0 |
| | | Thickness (μm) | 30 | 12 | 12 | 12 | 12 | 12 |
| Evaluation | Expansion rate | MD direction (%) | 133 | 129 | 129 | 129 | 137 | 142 |
| | | TD direction (%) | 135 | 130 | 130 | 130 | 135 | 143 |
| | Anisotropy (%) of expansion rate | | 2.0 | 1.0 | 1.0 | 1.0 | 2.0 | 1.0 |
| | Necking | Portion in contact with Stage | ○ | ○ | ○ | ○ | ○ | ○ |
| | | Portion in contact with Edge of Stage | ○ | ○ | ○ | ○ | ○ | ○ |
| | Handling performance | Tensile modulus (MPa) | 110 | 115 | 124 | 122 | 110 | 106 |
| | | | ○ | ○ | ○ | ○ | ○ | ○ |

TABLE 7

| | | | Comparative Example 1 | Comparative Example 2 | Comparative Example 3 | Comparative Example 4 | Comparative Example 5 | Comparative Example 6 |
|---|---|---|---|---|---|---|---|---|
| Sheet configuration | Low friction layer | Type of resin | Evolue SP2040 | Evolue SP2040 | Evolue SP2040 | Evolue SP2040 | Evolue SP2040 | Evolue SP2040 |
| | | Tensile modulus (MPa) | 19 | 19 | 19 | 19 | 19 | 19 |
| | | MFR(g/10 min) | 3.8 | 3.8 | 3.8 | 3.8 | 3.8 | 3.8 |
| | | Thickness (μm) | 8 | 8 | 8 | 8 | 8 | 8 |
| | Substrate layer | 1-Butene-α-olefin copolymer A | A1 | A2 | A3 | A1 | A1 | A1 |
| | | Tensile modulus (A) (MPa) | 430 | 200 | 180 | 430 | 430 | 430 |
| | | Density (kg/m³) | 915 | 900 | 900 | 915 | 915 | 915 |
| | | MFR at 230° C. (g/10 min) | 4.8 | 10 | 8 | 4.8 | 4.8 | 4.8 |
| | | Propylenic elastomer composition B | — | — | — | B1 | B2 | B2 |
| | | Tensile modulus (B) (MPa) | — | — | — | 42 | 12 | 12 |
| | | Density (kg/m³) | — | — | — | 868 | 866 | 866 |
| | | MFR at 230° C. (g/10 min) | — | — | — | 4 | 6 | 6 |
| | | Mixing ratio A/B | 100/0 | 100/0 | 100/0 | 80/20 | 80/20 | 20/80 |
| | | Tensile modulus (A/B) (MPa) | 430 | 180 | 200 | 352 | 346 | 96 |
| | | Thickness (μm) | 60 | 60 | 60 | 64 | 64 | 64 |
| | Adhesive layer | Type of resin | PN3560 | PN3560 | PN3560 | PN3560 | PN3560 | PN3560 |
| | | Tensile modulus (MPa) | 12 | 12 | 12 | 12 | 12 | 12 |
| | | MFR (g/10 min) | 6 | 6 | 6 | 6 | 6 | 6 |
| | | Adhesive force (N/25 mm) | 3.0 | 3.0 | 3.0 | 3.0 | 3.0 | 3.0 |
| | | Thickness (μm) | 12 | 12 | 12 | 12 | 12 | 12 |
| Evaluation | Expansion rate | MD direction (%) | 115 | 107 | 111 | 125 | 119 | 114 |
| | | TD direction (%) | 116 | 108 | 110 | 124 | 120 | 116 |
| | Anisotropy (%) of expansion rate | | 1.0 | 1.0 | 1.0 | 1.0 | 1.0 | 2.0 |
| | Necking | Portion in contact with Stage | x | ○ | ○ | x | x | ○ |
| | | Portion in contact with Edge of Stage | x | ○ | ○ | x | x | ○ |
| | Handling performance | Tensile modulus (MPa) | 200 | 130 | 140 | 170 | 145 | 30 |
| | | | x | ○ | ○ | x | ○ | x |

TABLE 8

|  |  |  | Comparative Example 7 | Comparative Example 8 | Comparative Example 9 |
|---|---|---|---|---|---|
| Sheet configuration | Low friction layer | Type of resin | Evolue SP2040 | Evolue SP2040 | Evolue SP2040 |
|  |  | Tensile modulus (MPa) | 105 | 105 | 105 |
|  |  | MFR(g/10 min) | 3.8 | 3.8 | 3.8 |
|  |  | Thickness (μm) | 8 | 8 | 8 |
|  | Substrate layer | 1-Butene-α-olefin copolymer (A) | A1 | A1 | A1 |
|  |  | Tensile modulus (A) (MPa) | 430 | 430 | 430 |
|  |  | Density (kg/m$^3$) | 915 | 915 | 915 |
|  |  | MFR at 230° C. (g/10 min) | 4.8 | 4.8 | 4.8 |
|  |  | Propylene elastomer composition (B) | P0275 | DYNARON DR8601P | DYNARON DR1322P |
|  |  | Tensile modulus (B) (MPa) | 11 | 7 | 1.8 |
|  |  | Density (kg/m$^3$) | 858-870 | 890 | 890 |
|  |  | MFR at 230° C. (g/10 min) | 5.3 | 3.5 | 3.5 |
|  |  | Mixing ratio A/B | 50/50 | 50/50 | 50/50 |
|  |  | Tensile modulus (A/B) (MPa) | 220.5 | 218.5 | 215.9 |
|  |  | Thickness (μm) | 68 | 68 | 68 |
|  | Adhesive layer | Type of resin | PN3560 | PN3560 | PN3560 |
|  |  | Tensile modulus (MPa) | 12 | 12 | 12 |
|  |  | MFR(g/10 min) | 6 | 6 | 6 |
|  |  | Adhesive force (N/25 mm) | 3 | 3 | 3 |
|  |  | Thickness (μm) | 12 | 12 | 12 |
| Evaluation | Expansion rate | MD direction (%) | 127 | 127 | 129 |
|  |  | TD direction (%) | 120 | 147 | 129 |
|  | Anisotropy (%) of expansion rate |  | 7 | 20 | 0 |
|  | Necking | Portion in contact with Stage | ○ | x | x |
|  |  | Portion in contact with Edge of Stage | x | x | ○ |
|  | Handling performance | Tensile modulus (MPa) | 63 | 36 | 21 |
|  |  |  | x | x | x |

TABLE 9

|  |  |  | Comparative Example 10 | Comparative Example 11 | Comparative Example 12 |
|---|---|---|---|---|---|
| Sheet configuration | Low friction layer | Type of resin | — | — | — |
|  |  | Tensile modulus (MPa) | — | — | — |
|  |  | MFR(g/10 min) | — | — | — |
|  |  | Thickness (μm) | — | — | — |
|  | Substrate layer | Highly crystalline polymer | h-PP | HDPE/EPR | h-PP/EPR |
|  |  | Tensile modulus (A) (MPa) | 1400 | 860/11 | 1400/11 |
|  |  | Density (kg/m$^3$) | 910 | 956/858 | 910/858 |
|  |  | MFR at 230° C. (g/10 min) | 7.0 | 6.0/5.3 | 7.6/5.3 |
|  |  | Lowly crystalline polymer | LDPE | r-PP | EMAA |
|  |  | Tensile modulus (B) (MPa) | 140 | 820 | 26 |
|  |  | Density (kg/m$^3$) | 917 | 910 | 940 |
|  |  | MFR at 230° C. (g/10 min) | 7.0 | 7.8 | 8.0 |
|  |  | Highly crystalline polymer/Lowly crystalline polymer | 30/70 | 30/10/60 | 20/10/70 |
|  |  | Tensile modulus (A/B) (MPa) | 518 | 751 | 290 |
|  |  | Thickness (μm) | 100 | 100 | 100 |
|  | Adhesive layer | Type of resin | — | — | — |
|  |  | Tensile modulus (MPa) | — | — | — |
|  |  | MFR (g/10 min) | — | — | — |
|  |  | Adhesive force (N/25 mm) | — | — | — |
|  |  | Thickness (μm) | — | — | — |
| Evaluation | Expansion rate | MD direction (%) | Ruptured | Ruptured | Ruptured |
|  |  | TD direction (%) | Ruptured | Ruptured | Ruptured |
|  | Anisotropy (%) of expansion rate |  | Unevaluable | Unevaluable | Unevaluable |
|  | Necking | Portion in contact with Stage | Unevaluable | Unevaluable | Unevaluable |
|  |  | Portion in contact with Edge of Stage | Unevaluable | Unevaluable | Unevaluable |
|  | Handling performance | Tensile modulus (MPa) | 270 | 420 | 200 |
|  |  |  | x | x | x |

The films in Examples 1 to 18, having substrate layers prepared by blending of a specific 1-butene-α-olefin copolymer (A) and a specific propylenic elastomer composition (B) in a predetermined ratio, each exhibit a high expansion rate of 120% or more and no necking. In contrast, the films in Comparative Examples 1 to 3, not containing specific propylenic elastomer composition (B) and the films in Comparative Examples 4 to 6, where the ratio of the 1-butene-α-olefin copolymer (A) to the propylenic elastomer composition (B) is outside the present invention, exhibit low expansion rate, poor handling performance, or tendency to necking. The films in Comparative Examples 7 to 9, the propylenic elastomer composition (B) was replaced with any other elastomer, exhibit satisfactory expandability, but exhibit tendency to necking or poor handling performance. The films in Comparative Examples 10 to 12 were ruptured during the expansion test, indicating significantly low expandability.

Example 19

Preparation of Materials for Individual Layers

A blend of a 1-butene-α-olefin copolymer (A1) and a propylenic elastomer composition (B1) in a mass ratio of 60/40 was prepared as a raw material for a substrate layer. TAFMER P0275 (registered trade mark) available from Mitsui Chemicals, Inc. was prepared as a raw material for an intermediate layer. The UV-curable adhesive coating solution described above was prepared as a raw material for an adhesive layer. A blend the same as that for the substrate layer was prepared as a raw material for a low-friction layer.

Formation of Dicing Film

The raw materials for the substrate layer, intermediate layer, and low-friction layer were each melt-kneaded in an extruder equipped with a full-flight screw. These three melted resins were coextruded from a multilayer die at an extrusion temperature of 230° C. for the substrate layer, intermediate layer, and low-friction layer into a triple-layer laminate. An adhesive layer was laminated onto the intermediate layer as in the manner for lamination of a UV adhesive layer in Example 13 to form a four-layered laminate film (dicing film) including the low-friction layer, substrate layer, intermediate layer, and adhesive layer in this order as shown in FIG. 3. In the dicing film, the low-friction layer, substrate layer, intermediate layer, and adhesive layer have thicknesses of 10 μm, 60 μm, 350 μm, and 5 μm, respectively.

Examples 20 and 21

Dicing films were formed as in Example 19, except that the blend ratio of the 1-butene-α-olefin copolymer (A1) to the propylenic elastomer composition (B1) in the substrate layer was changed as shown in Table 10.

Example 22

A dicing film was formed as in Example 19, except that the propylenic elastomer composition (B1) for the substrate layer was replaced with a propylenic elastomer composition (B2).

Example 23

A dicing film was formed as in Example 19, except that the propylenic elastomer composition (B1) for the substrate layer was replaced with a propylenic elastomer composition (B3).

Example 24

A dicing film was formed as in Example 19, except that the propylenic elastomer composition (B1) for the substrate layer was replaced with a propylenic elastomer composition (B4).

Example 25

A dicing film was formed as in Example 19, except that the material for the low-friction layer was changed to a linear low-density polyethylene, trade name Evolue SP2040 (available from Prime Polymer Co., Ltd., Vicat softening point: 101° C.), the extrusion temperature of the substrate layer, intermediate layer, adhesive layer, and low-friction layer was 230° C., and four melted resins were laminated by coextrusion through a multilayer die. In the dicing film, the thicknesses of the low-friction layer, substrate layer, intermediate layer, and adhesive layer were 10 μm, 60 μm, 350 μm, and 5 respectively.

Example 26

A dicing film was formed as in Example 25, except that the material for the low-friction layer was changed to a mixture of low-density polyethylene (available from DUPONT-MITSUI POLYCHEMICALS CO., LTD., trade name: Milason 11P) and 5 wt % silicone resin (available from Dow Corning Toray Co., Ltd., trade name BY27-002).

Example 27

A dicing film was formed as in Example 25, except that the material for the intermediate layer was changed to TAFMER P0280 (registered trade mark) available from Mitsui Chemicals, Inc.

Example 28

A dicing film was formed as in Example 25, except that the material for the adhesive layer was changed to NOTIO PN3560 (trade name, available from Mitsui Chemicals, Inc., MFR: 4 g/10 min at a temperature of 230° C. in accordance with ASTM D1238).

Example 29

A dicing film was formed as in Example 25, except that the material for the adhesive layer was changed to NOTIO PN2060 (trade name, available from Mitsui Chemicals, Inc., MFR: 7 g/10 min at a temperature of 230° C. in accordance with ASTM D1238).

Example 30

A dicing film was formed as in Example 25, except that the material for the adhesive layer was changed to a hydrogenated styrene-butadiene rubber (HSBR), Dynaron DR1322P (registered trade mark, available from JSR Corporation).

Comparative Example 13

A dicing film was formed as in EXAMPLE 25, except that the material for the substrate layer was composed of only the 1-butene-α-olefin copolymer (A1).

Comparative Example 14

A dicing film was formed as in Example 25, except that the ratio of the 1-butene-α-olefin copolymer (A1) to the propylenic elastomer composition (B1) in the substrate layer was changed to 80/20.

Comparative Example 15

A dicing film was formed as in Example 25, except that the ratio of the 1-butene-α-olefin copolymer (A1) to the propylenic elastomer composition (B1) in the substrate layer was changed to 20/80.

Comparative Example 16

A dicing film was formed as in Example 19, except that a polyethylene terephthalate layer with a thickness of 75 μm was used as the substrate layer, and the low-friction layer was not laminated.

Comparative Example 17

A dicing film was formed as in Example 25, except that an ethylene-vinyl acetate (EVA) copolymer layer with a thickness of 60 μm was used as the substrate layer.

Example 31

A dicing film was formed as in Example 25, except that an ethylene-vinyl acetate (EVA) copolymer layer with a thickness of 350 μm was used as the intermediate layer.

Example 32

A dicing film was formed as in Example 25, except that the adhesive layer was not laminated.

Example 33

A dicing film was formed as in Example 10, except that the thickness of the substrate layer was changed to 60 μm.

Example 34

A dicing film was formed as in Example 33, except that the propylenic elastomer composition (B1) for the substrate layer was replaced with a propylenic elastomer composition (B5).

Example 35

A dicing film was formed as in Example 33, except that the propylenic elastomer composition (B1) for the substrate layer was replaced with a propylenic elastomer composition (B6).

Example 36

A dicing film was formed as in Example 33, except that the propylenic elastomer composition (B1) for the substrate layer was replaced with a propylenic elastomer composition (B7).

Example 37

A dicing film was formed as in Example 33, except that the propylenic elastomer composition (B1) of the substrate layer was replaced with a propylenic elastomer composition (B 8).

Comparative Example 18

A dicing film was formed as in Example 33, except that the propylenic elastomer composition (B1) for the substrate layer was replaced with a propylenic elastomer composition (B9).

Reference Example 1

The dicing film in Example 25 was subjected to irregularity absorption evaluation (described below) at a table temperature of 25° C., a roller temperature of 25° C., and a pressure of 0.5 MPa.

Reference Example 2

The dicing film in Example 25 was subjected to irregularity absorption evaluation (described below) at a table temperature of 60° C., a roller temperature of 60° C., and a pressure of 0.2 MPa.

Reference Example 3

A dicing film was formed as in Example 25, except that the thickness of the intermediate layer of the dicing film was changed to 180 μm.

Evaluation of Dicing Film

For Examples 19 to 31, Comparative Examples 13 to 17, and Reference Examples 1 to 3, the adhesive force to a ring frame, irregularity absorption, and expandability was determined. The tensile modulus, MFR, density, and adhesive force of individual layers and materials constituting the layers were also measured as in Examples 1 to 18. For the intermediate layer, the tensile modulus E(25) at 25° C. and the tensile modulus E(60) at 60° C. were measured, and the ratio (E(60)/E(25)) of the E(60) at 60° C. to the E(25) at 25° C. was calculated.

For Examples 33 to 37 and Comparative Example 18, the resulting films were subjected to evaluation of 1) expandability, 2) tendency to necking, and 3) handling performance, and 4) adhesive force of the adhesive layer, as in Examples 1 to 18.

1) Adhesiveness to Ring Frame

The adhesiveness of each film to a ring frame made by DISCO Corporation was measured. In detail, the adhesive force of the resulting dicing film to the ring frame was measured at a temperature of 23° C. and a relative humidity of 50% by the testing method of pressure-sensitive adhesive tapes and sheets in accordance with JIS Z0237. The dicing film was placed on the ring frame on the adhesive layer side, was bonded to the ring frame under a pressure of about 2 kg with a rubber roller, and was allowed to stand for 30 minutes under a constant environment at a temperature of 23° C. and a relative humidity of 50%. The adhesive force was determined when the dieing film was peeled off from the ring frame at a peeling rate of 300 min/min in the direction perpendicular to a surface of the ring frame. The measurement of the adhesive force was repeated twice. The average measured for two test samples was defined as "adhesive force (N) to ring frame". An adhesive force of 0.1 N or more to the ring frame was evaluated as ○, an adhesive force of less than 0.1N as x.

2) Undulation Embedment

A wafer (made by Well, JCHIP10) provided with solder balls having a diameter of 200 on a face provided with circuits was prepared. A dicing film was bonded to the DISCO ring frame and the wafer with a wafer mounter (made by Technovision, Inc., FMP-1143) at a table temperature of 60° C., a roller temperature of 25° C., a pressure of 0.5 MPa, and a lamination rate of 2 mm/sec. The face provided with circuits after bonding the dicing film was observed with a microscope (made by Keyence Corporation) at a magnification of 50 to 200. Samples having gaps between the irregularities on the patterned side and the dicing film were evaluated as x, and samples with no gap were evaluated as ○.

3) Expandability

The adhesive layer of the dicing film was put into close contact with the ring frame with a rubber roller. The non-adhesive dicing film (Comparative Example 19) was fixed to the ring frame with a double-sided adhesive tape (NICHIBAN Co., Ltd., Nicetack). A grid pattern consisting of 2-cm squares was written on the surface of the adhesive layer of the dicing film with a permanent marker. As shown in FIG. 6A, the ring frame 44 was fixed to an expander such that the surface of the substrate layer of the dicing film 40 came into contact with the stage 43 of the expander. The expander used was HS-1800 made by Hugle Electronics Inc.

As shown in FIG. 6B, the stage 43 of the expander was lifted up by 65 mm to measure the lengths of the grid in the TD and MD directions after the film 40 was expanded. The observed values were inserted into the following equation to determine the expansion rate and anisotropy of the expansion rate.

Expansion rate(*MD* and *TD* directions)(%)=100× (length of grid after expansion)/(length of grid before expansion)

Samples having an expansion rate of 120% or more were evaluated as ○, and samples having an expansion rate of less than 120% as x.

The results in Examples 19 to 24 are shown in Table 10; the results in Examples 25 to 30 in Table 11; the results in Comparative Examples 13 to 17 in Table 12; the results in Examples 31, 32, and Reference Examples 1 to 3 in Table 13; and the results in Examples 33 to 37 and Comparative Example 18 in Table 14

TABLE 10

| | | | Example 19 | Example 20 | Example 21 | Example 22 | Example 23 | Example 24 |
|---|---|---|---|---|---|---|---|---|
| Sheet configuration | Low-friction layer | Type of resin | Same as substrate layer | Same as substrate layer | Same as substrate layer | Same as substrate layer | Same as substrate layer | Same as substrate layer |
| | | MFR at 230° C. (g/10 min) | | | | | | |
| | | Thickness (μm) | 10 | 10 | 10 | 10 | 10 | 10 |
| | Substrate layer | 1-Butene-α-olefin copolymer (A) | A1 | A1 | A1 | A1 | A1 | A1 |
| | | Tensile modulus (A) (MPa) | 430 | 430 | 430 | 430 | 430 | 430 |
| | | Density (kg/m³) | 915 | 915 | 915 | 915 | 915 | 915 |
| | | MFR at 230° C. (g/10 min) | 4.8 | 4.8 | 4.8 | 4.8 | 4.8 | 4.8 |
| | | Propylenic elastomer composition (B) | B1 | B1 | B1 | B2 | B3 | B4 |
| | | Tensile modulus (B) (MPa) | 42 | 42 | 42 | 12 | 25 | 16 |
| | | Density (kg/m³) | 868 | 868 | 868 | 866 | 868 | 867 |
| | | MFR at 230° C. (g/10 min) | 4 | 4 | 4 | 6 | 4 | 4 |
| | | Mixing ratio A/B | 60/40 | 50/50 | 40/60 | 60/40 | 60/40 | 60/40 |
| | | Tensile modulus (A/B) (MPa) | 275 | 236 | 197 | 275 | 220 | 190 |
| | | Thickness (μm) | 60 | 60 | 60 | 60 | 60 | 60 |
| | Intermediate layer | Material | TAFMER P0275 | TAFMER P0275 | TAFMER P0275 | TAFMER P0275 | TAFMER P0275 | TAFMER P0275 |
| | | Density (kg/m³) | 861 | 861 | 861 | 861 | 861 | 861 |
| | | MFR at 230° C. (g/10 min) | 5.3 | 5.3 | 5.3 | 5.3 | 5.3 | 5.3 |
| | | Tensile modulus E(25) (MPa) | 5.5 | 5.5 | 5.5 | 5.5 | 5.5 | 5.5 |
| | | Tensile modulus E(60) (MPa) | 0.16 | 0.16 | 0.16 | 0.16 | 0.16 | 0.16 |
| | | E(60)/E(25) | 0.029 | 0.029 | 0.029 | 0.029 | 0.029 | 0.029 |
| | | Thickness (μm) | 350 | 350 | 350 | 350 | 350 | 350 |
| | Adhesive layer | Material | UV adhesion | UV adhesion | UV adhesion | UV adhesion | UV adhesion | UV adhesion |
| | | Adhesive force (N/25 mm) | 7 | 7 | 7 | 7 | 7 | 7 |
| | | MFR at 230° C. (g/10 min) | — | — | — | — | — | — |
| | | Thickness (μm) | 5 | 5 | 5 | 5 | 5 | 5 |
| Bonding condition | | Bonding temperature (° C.) | 60 | 60 | 60 | 60 | 60 | 60 |
| | | Bonding pressure (MPa) | 0.5 | 0.5 | 0.5 | 0.5 | 0.5 | 0.5 |
| Wafer | | Height of irregularities (μm) | 200 | 200 | 200 | 200 | 200 | 200 |
| Evaluation results | | Adhesion to ring frame | ○ | ○ | ○ | ○ | ○ | ○ |
| | | Undulation embedment | ○ | ○ | ○ | ○ | ○ | ○ |
| | | Expandability (>120%) | ○ | ○ | ○ | ○ | ○ | ○ |

TABLE 11

| | | | Example 25 | Example 26 | Example 27 | Example 28 | Example 29 | Example 30 |
|---|---|---|---|---|---|---|---|---|
| Sheet configuration | Low friction layer | Type of resin | Evolue SP2040 | Milason 11P + BY27-002 (5 wt %) | Evolue SP2040 | Evolue SP2040 | Evolue SP2040 | Evolue SP2040 |
| | | MFR at 230° C. (g/10 min) | 3.8 | 6.0 | 3.8 | 3.8 | 3.8 | 3.8 |
| | | Thickness (μm) | 10 | 10 | 10 | 10 | 10 | 10 |
| | Substrate layer | 1-Butene-α-olefin copolymer (A) | A1 | A1 | A1 | A1 | A1 | A1 |
| | | Tensile modulus (A) (MPa) | 430 | 430 | 430 | 430 | 430 | 430 |
| | | Density (kg/m³) | 915 | 915 | 915 | 915 | 915 | 915 |
| | | MFR at 230° C. (g/10 min) | 4.8 | 4.8 | 4.8 | 4.8 | 4.8 | 4.8 |
| | | Propylenic elastomer composition (B) | B1 | B1 | B1 | B1 | B1 | B1 |
| | | Tensile modulus (B) (MPa) | 42 | 42 | 42 | 42 | 42 | 42 |
| | | Density (kg/m³) | 868 | 868 | 868 | 868 | 868 | 868 |
| | | MFR at 230° C. (g/10 min) | 4 | 4 | 4 | 4 | 4 | 4 |
| | | Mixing ratio A/B | 60/40 | 60/40 | 60/40 | 60/40 | 60/40 | 60/40 |
| | | Tensile modulus (A/B) (MPa) | 275 | 275 | 275 | 275 | 275 | 275 |
| | | Thickness (μm) | 60 | 60 | 60 | 60 | 60 | 60 |
| | Intermediate layer | Material | TAFMER P0275 | TAFMER P0275 | TAFMER P0280 | TAFMER P0275 | TAFMER P0275 | TAFMER P0275 |

TABLE 11-continued

|  |  |  | Example 25 | Example 26 | Example 27 | Example 28 | Example 29 | Example 30 |
|---|---|---|---|---|---|---|---|---|
|  |  | Density (kg/m³) | 861 | 861 | 869 | 861 | 861 | 861 |
|  |  | MFR at 230° C. (g/10 min) | 5.3 | 5.3 | 5.3 | 5.3 | 5.3 | 5.3 |
|  |  | Tensile modulus E(25) (MPa) | 5.5 | 5.5 | 9.6 | 5.5 | 5.5 | 5.5 |
|  |  | Tensile modulus E(60) (MPa) | 0.16 | 0.16 | 0.24 | 0.16 | 0.16 | 0.16 |
|  |  | E(60)/E(25) | 0.029 | 0.029 | 0.025 | 0.029 | 0.029 | 0.029 |
|  |  | Thickness (μm) | 350 | 350 | 350 | 350 | 350 | 350 |
|  | Adhesive layer | Material | UV adhesion | UV adhesion | UV adhesion | Notio PN3560 | Notio PN2060 | DYNARON DR1322P |
|  |  | Adhesive force (N/25 mm) | 7 | 7 | 7 | 6 | 4 | 1.8 |
|  |  | MFR at 230° C.(g/10 min) | — | — | — | 6 | 6 | 4 |
|  |  | Thickness (μm) | 5 | 5 | 5 | 5 | 5 | 5 |
| Bonding condition | Bonding temperature (° C.) |  | 60 | 60 | 60 | 60 | 60 | 60 |
|  | Bonding pressure (MPa) |  | 0.5 | 0.5 | 0.5 | 0.5 | 0.5 | 0.5 |
| Wafer | Height of irregularities (μm) |  | 200 | 200 | 200 | 200 | 200 | 200 |
| Evaluation results | Adhesion to ring frame |  | ○ | ○ | ○ | ○ | ○ | ○ |
|  | Undulation embedment |  | ○ | ○ | ○ | ○ | ○ | ○ |
|  | Expandability (>120%) |  | ○ | ○ | ○ | ○ | ○ | ○ |

TABLE 12

|  |  |  | Comparative Example 13 | Comparative Example 14 | Comparative Example 15 | Comparative Example 16 | Comparative Example 17 |
|---|---|---|---|---|---|---|---|
| Sheet configuration | Low-friction layer | Type of resin | Evolue SP2040 | Evolue SP2040 | Evolue SP2040 | None | Evolue SP2040 |
|  |  | MFR at 230° C. (g/10 min) | 3.8 | 3.8 | 3.8 |  | 3.8 |
|  |  | Thickness (μm) | 5 | 5 | 5 |  | 5 |
|  | Substrate layer | 1-Butene-α-olefin copolymer (A) | A1 | A1 | A1 | PET | EVA |
|  |  | Tensile modulus (A) (MPa) | 430 | 430 | 430 | 4000 | 9.5 |
|  |  | Density (kg/m³) | 915 | 915 | 915 | 1270 | 960 |
|  |  | MFR at 230° C. (g/10 min) | 4.8 | 4.8 | 4.8 | — | 30 |
|  |  | Propylenic elastomer composition (B) | None | B1 | B2 | None | None |
|  |  | Tensile modulus (B) (MPa) | — | 42 | 12 | — | — |
|  |  | Density (kg/m³) | — | 868 | 866 | — | — |
|  |  | MFR at 230° C. (g/10 min) | — | 4 | 6 | — | — |
|  |  | Mixing ratio A/B | 100/0 | 80/20 | 20/80 | 100/0 | 100/0 |
|  |  | Tensile modulus (A/B) (MPa) | — | 352 | 96 | — | — |
|  |  | Thickness (μm) | 60 | 60 | 60 | 75 | 60 |
|  | Intermediate layer | Material | TAFMER P0275 | TAFMER P0275 | TAFMER P0275 | TAFMER P0275 | TAFMER P0275 |
|  |  | Density (kg/m³) | 861 | 861 | 861 | 861 | 861 |
|  |  | MFR at 230° C. (g/10 min) | 5.3 | 5.3 | 5.3 | 5.3 | 5.3 |
|  |  | Tensile modulus E(25) (MPa) | 5.5 | 5.5 | 5.5 | 5.5 | 5.5 |
|  |  | Tensile modulus E(60) (MPa) | 0.16 | 0.16 | 0.16 | 0.16 | 0.16 |
|  |  | E(60)/E(25) | 0.029 | 0.029 | 0.029 | 0.029 | 0.029 |
|  |  | Thickness (μm) | 350 | 350 | 350 | 350 | 350 |
|  | Adhesive layer | Material | UV adhesion | UV adhesion | UV adhesion | UV adhesion | UV adhesion |
|  |  | Adhesive force (N/25 mm) | 7 | 7 | 7 | 7 | 7 |
|  |  | MFR at 230° C. (g/10 min) | — | — | — | — | — |
|  |  | Thickness (μm) | 5 | 5 | 5 | 5 | 5 |
| Bonding condition | Bonding temperature (° C.) |  | 60 | 60 | 60 | 60 | 60 |
|  | Bonding pressure (MPa) |  | 0.5 | 0.5 | 0.5 | 0.5 | 0.5 |
| Wafer | Height of irregularities (μm) |  | 200 | 200 | 200 | 200 | 200 |
| Evaluation results | Adhesion to ring frame |  | ○ | ○ | ○ | ○ | ○ |
|  | Undulation embedment |  | ○ | ○ | ○ | ○ | ○ |
|  | Expandability (>120%) |  | x | x | x | x | x |

TABLE 13

|  |  |  | Example 31 | Example 32 | Reference Example 1 | Reference Example 2 | Reference Example 3 |
|---|---|---|---|---|---|---|---|
| Sheet configuration | Low-friction layer | Type of resin | Evolue SP2040 | Evolue SP2040 | Evolue SP2040 | Evolue SP2040 | Evolue SP2040 |
|  |  | MFR at 230° C. (g/10 min) | 3.8 | 3.8 | 3.8 | 3.8 | 3.8 |
|  |  | Thickness (μm) | 5 | 5 | 5 | 5 | 5 |

TABLE 13-continued

|  |  |  | Example 31 | Example 32 | Reference Example 1 | Reference Example 2 | Reference Example 3 |
|---|---|---|---|---|---|---|---|
| | Substrate layer | 1-Butene-α-olefin copolymer (A) | A1 | A1 | A1 | A1 | A1 |
| | | Tensile modulus (A) (MPa) | 430 | 430 | 430 | 430 | 430 |
| | | Density (kg/m³) | 915 | 915 | 915 | 915 | 915 |
| | | MFR at 230° C. (g/10 min) | 4.8 | 4.8 | 4.8 | 4.8 | 4.8 |
| | | Propylenic elastomer composition (B) | B1 | B1 | B1 | B1 | B1 |
| | | Tensile modulus (B) (MPa) | 42 | 42 | 42 | 42 | 42 |
| | | Density (kg/m³) | 868 | 868 | 868 | 868 | 868 |
| | | MFR at 230° C. (g/10 min) | 4 | 4 | 4 | 4 | 4 |
| | | Mixing ratio A/B | 60/40 | 60/40 | 60/40 | 60/40 | 60/40 |
| | | Tensile modulus (A/B) (MPa) | 275 | 275 | 275 | 275 | 275 |
| | | Thickness (μm) | 60 | 60 | 60 | 60 | 60 |
| | Intermediate layer | Material | EVA | TAFMER P0275 | TAFMER P0275 | TAFMER P0275 | TAFMER P0275 |
| | | Density (kg/m³) | 960 | 861 | 861 | 861 | 861 |
| | | MFR at 230° C. (g/10 min) | 30 | 5.3 | 5.3 | 5.3 | 5.3 |
| | | Tensile modulus E(25) (MPa) | 9.5 | 5.5 | 5.5 | 5.5 | 5.5 |
| | | Tensile modulus E(60) (MPa) | 1.2 | 0.16 | 0.16 | 0.16 | 0.16 |
| | | E(60)/E(25) | 0.126 | 0.029 | 0.029 | 0.029 | 0.029 |
| | | Thickness (μm) | 350 | 350 | 350 | 350 | 180 |
| | Adhesive layer | Material | UV adhesion | None | UV adhesion | UV adhesion | UV adhesion |
| | | Adhesive force (N/25 mm) | 7 | Non-adhesive | 7 | 7 | 7 |
| | | MFR at 230° C. (g/10 min) | — | — | — | — | — |
| | | Thickness (μm) | 5 | — | 5 | 5 | 5 |
| Bonding condition | Bonding temperature (° C.) | | 60 | 60 | 25 | 60 | 60 |
| | Bonding pressure (MPa) | | 0.5 | 0.5 | 0.5 | 0.2 | 0.5 |
| Wafer | Height of irregularities (μm) | | 200 | 200 | 200 | 200 | 200 |
| Evaluation Results | Adhesion to ring frame | | ○ | x | ○ | ○ | ○ |
| | Undulation embedment | | x | ○ | x | x | x |
| | Expandability (>120%) | | ○ | ○ | ○ | ○ | ○ |

TABLE 14

|  |  |  | Example 33 | Example 34 | Example 35 | Example 36 | Example 37 | Comparative Example 18 |
|---|---|---|---|---|---|---|---|---|
| Sheet configuration | Low friction layer | Type of resin | The same as substrate layer | The same as substrate layer | The same as substrate layer | The same as substrate layer | The same as substrate layer | The same as substrate layer |
| | | Tensile modulus (MPa) | | | | | | |
| | | MFR at 230° C. (g/10 min) | | | | | | |
| | | Thickness (μm) | 8 | 8 | 8 | 8 | 8 | 8 |
| | Substrate layer | 1-Butene-α-olefin copolymer (A) | A1 | A1 | A1 | A1 | A1 | A1 |
| | | Tensile modulus (A) (MPa) | 430 | 430 | 430 | 430 | 430 | 430 |
| | | Density (kg/m³) | 915 | 915 | 915 | 915 | 915 | 915 |
| | | MFR at 230° C. (g/10 min) | 4.8 | 4.8 | 4.8 | 4.8 | 4.8 | 4.8 |
| | | Propylenic elastomer composition (B) | B1 | B5 | B6 | B7 | B8 | B9 |
| | | Tensile modulus (B) (MPa) | 42 | 60 | 90 | 160 | 420 | 700 |
| | | Density (kg/m³) | 868 | 866 | 868 | 867 | 867 | 867 |
| | | MFR at 230° C. (g/10 min) | 4 | 6 | 6 | 7 | 7 | 7 |
| | | Mixing ratio A/B | 50/50 | 50/50 | 50/50 | 50/50 | 50/50 | 50/50 |
| | | Tensile modulus (A/B) (MPa) | 236 | 245 | 260 | 295 | 435 | 570 |
| | | Thickness (μm) | 60 | 60 | 60 | 60 | 60 | 60 |
| | Adhesive layer | Type of resin | PN3560 | PN3560 | PN3560 | PN3560 | PN3560 | PN3560 |
| | | Tensile modulus (MPa) | 12 | 12 | 12 | 12 | 12 | 12 |
| | | MFR at 230° C. (g/10 min) | 6 | 6 | 6 | 6 | 6 | 6 |
| | | Adhesive force (N/25 mm) | 6 | 6 | 6 | 6 | 6 | 6 |
| | | Thickness (μm) | 12 | 12 | 12 | 12 | 12 | 12 |
| Evaluation | Expansion rate | MD direction (%) | 139 | 142 | 139 | 129 | 120 | Fractured |
| | | TD direction (%) | 139 | 142 | 138 | 127 | 118 | Fractured |
| | Anisotropy (%) of expansion rate | | 0 | 0 | 1.2 | 1.4 | 2.3 | Unevaluable |
| | Necking | (Face on stage) | ○ | ○ | ○ | ○ | ○ | Unevaluable |
| | | (At periphery of stage) | ○ | ○ | ○ | ○ | ○ | Unevaluable |
| | Handling performance | Tensile modulus (MPa) | 123 | 125 | 128 | 145 | 168 | 210 |
| | | Evaluation | ○ | ○ | ○ | ○ | ○ | x |

The films in Examples 19 to 32, having substrate layers prepared by blend of a specific 1-butene-α-olefin copolymer (A) and a specific propylenic elastomer composition (B) in a predetermined ratio, each exhibit a high expansion rate of 120% or more. In contrast, the films in Comparative Example 13, not containing the specific propylenic elastomer composition (B), and the film in Comparative Examples 14 and 15, where the ratio of the 1-butene-α-olefin copolymer (A) to the propylenic elastomer composition (B) is outside the present invention, each exhibit a low expansion rate. The films in Comparative Examples 16 and 17, not containing the specific 1-butene-α-olefin copolymer (A) and the specific propylenic elastomer composition (B), each exhibit a low expansion rate.

The intermediate layer disposed between the substrate layer and the adhesive layer, satisfying the relation: $E(60)/E(25)<0.1$ where $E(25)$ is tensile modulus at 25° C. and $E(60)$ is tensile modulus at 60° C. and having a tensile modulus $E(25)$ at 25° C. of 1 to 10 MPa improves irregularity absorption (Examples 19 to 30 and 32). In contrast, Example 31 not satisfying the relation: $E(60)/E(25)<0.1$ exhibits poor irregularity absorption.

The adhesive layer having predetermined adhesive force achieves tight contact to the ring frame (Examples 19 to 30). In contrast, the film not provided with an adhesive layer (Example 32) exhibits low adhesive force to the ring frame.

Reference Example 1 indicates the dicing film in Example 25 bonded to a wafer at a temperature less than that specified in the method of manufacturing a semiconductor device of the present invention. Because of insufficient melting of the intermediate layer, irregularity absorption is insufficient. Reference Example 2 indicates the dicing film in Example 25 bonded to a wafer under a pressure less than that specified in the method of manufacturing a semiconductor device of the resent invention. Because of insufficient melting of the intermediate layer and the adhesive layer, irregularity absorption is insufficient. Reference Example 3 indicates the dicing film in Example 25 including an intermediate layer having a thickness less than the height of irregularities on the wafer. Because of insufficient melting of the intermediate layer and the adhesive layer, irregularity absorption is insufficient.

The dicing films in Examples 33 to 37 containing 70 weight parts or less of polypropylene (b2) relative to 100 weight parts of propylenic elastomer composition (B) exhibit superior handling performance without necking. The expansion rate, however, decreases in the MD and TD directions as the amount of the polypropylene (b2) increases. The anisotropy of the expansion rate also increases with increasing amount. The dicing film in Comparative Example 18 containing the propylenic elastomer composition (B) having a tensile modulus exceeding 500 MPa is ruptured due to insufficient expansion.

INDUSTRIAL APPLICABILITY

The present invention provides an olefinic expandable substrate and a dicing film that exhibits less contamination, high expandability and less necking, which cannot be achieved by conventional olefinic expandable substrates.

REFERENCE SIGNS LIST

10, 30, 40, 50: dicing film
12, 32, 52: substrate layer
13, 53: intermediate layer
14, 34, 54: adhesive layer
16, 36, 56: low-friction layer
22, 42: wafer
43: stage
44: ring frame

The invention claimed is:

1. An expandable film comprising:
    a 1-butene-α-olefin copolymer (A) having a tensile modulus at 23° C. of 100 to 500 MPa; and
    a propylenic elastomer composition (B) comprising a propylene-α-olefin copolymer (b1) and having a tensile modulus at 23° C. of 8 to 500 MPa,
    wherein an amount of the composition (B) is in the range of 30 to 70 weight parts relative to 100 weight parts in total of the components (A) and (B).

2. The expandable film according to claim 1, wherein the propylenic elastomer composition (B) has a tensile modulus at 23° C. of 10 to 50 MPa.

3. The expandable film according to claim 1, wherein the propylenic elastomer composition (B) contains 1 to 70 weight parts of a polypropylene (b2) relative to 100 weight parts of the propylenic elastomer composition (B).

4. The expandable film according to claim 3, wherein the propylenic elastomer composition (B) contains 5 to 20 weight parts of the polypropylene (b2) relative to 100 weight parts of the propylenic elastomer composition (B).

5. A dicing film comprising: a substrate layer comprising the expandable film according to claim 1 and an adhesive layer.

6. The dicing film according to claim 5, further comprising an intermediate layer between the substrate layer and the adhesive layer, wherein the intermediate layer satisfies the relation $E(60)/E(25)<0.1$ where $E(25)$ is a tensile modulus at 25° C. and $E(60)$ is a tensile modulus at 60° C., and the tensile modulus at 25° C. is in the range of 1 to 10 MPa.

7. A method of manufacturing a semiconductor device, comprising:
    bonding a dicing film to a semiconductor wafer at a temperature of 40 to 80° C. and a pressure of 0.3 to 0.5 MPa with an adhesive layer of the dicing film;
    dicing the semiconductor wafer into semiconductor chips; and
    expanding the dicing film and picking up the semiconductor chips,
wherein the dicing film comprises a substrate layer comprising an expandable film, an intermediate layer satisfying the relation $E(60)/E(25)<0.1$ where $E(25)$ is a tensile modulus at 25° C. and $E(60)$ is a tensile modulus at 60° C., and the tensile modulus at 25° C. is in the range of 1 to 10 MPa, and the adhesive layer, wherein the adhesive layer is an outermost layer of the dicing film and wherein the expandable film comprises a 1-butane-α-olefin copolymer (A) having a tensile modulus at 23° C. of 100 to 500 MPa; and a propylenic elastomer composition (B) comprising a propylene-α-olefin copolymer (b1) and having a tensile modulus at 23° C. of 8 to 500 MPa, wherein an amount of the composition (B) is in the range of 30 to 70 weight parts relative to 100 weight parts in total of the components (A) and (B).

8. A method of manufacturing a semiconductor device, comprising:
    bonding a dicing film to a semiconductor wafer with an adhesive layer of the dicing film;
    dicing the semiconductor wafer into semiconductor chips; and
    expanding the dicing film and picking up the semiconductor chips,
wherein the dicing film comprises a substrate layer comprising an expandable film and the adhesive layer, wherein the adhesive layer is an outermost layer of the dicing film and wherein the expandable film comprises a 1-butane-α-olefin copolymer (A) having a tensile modulus at 23° C. of 100 to 500 MPa; and a propylenic elastomer composition (B) comprising a propylene-α-olefin copolymer (b1) and having a tensile modulus at 23° C. of 8 to 500 MPa, wherein an amount of the composition (B) is in the range of 30 to 70 weight parts relative to 100 weight parts in total of the components (A) and (B).

9. A dicing film comprising:
a substrate layer comprising the expandable film according to claim 1; and
an intermediate layer,
wherein the intermediate layer satisfies the relation $E(60)/E(25)<0.1$ where $E(25)$ is a tensile modulus at 25° C. and $E(60)$ is a tensile modulus at 60° C., and the tensile modulus at 25° C. is in the range of 1 to 10 MPa.

10. The dicing film according to claim 9, wherein the intermediate layer contains an olefinic copolymer.

11. The dicing film according to claim 9, wherein the intermediate layer has a density of 800 to 890 kg/m$^3$.

12. The dicing film according to claim 9, wherein the dicing film is for bonding on at least one surface of a semiconductor wafer, the surface having irregularities, and
the intermediate layer has a thickness larger than the height of the irregularities of the semiconductor wafer.

* * * * *